US012501603B2

(12) United States Patent
Kim et al.

(10) Patent No.: US 12,501,603 B2
(45) Date of Patent: Dec. 16, 2025

(54) CAPACITOR STRUCTURE AND SEMICONDUCTOR DEVICE INCLUDING THE SAME

(71) Applicant: Samsung Electronics Co., Ltd., Suwon-si (KR)

(72) Inventors: Beomjong Kim, Seoul (KR); Hanjin Lim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 498 days.

(21) Appl. No.: 17/878,201

(22) Filed: Aug. 1, 2022

(65) Prior Publication Data
US 2023/0255013 A1    Aug. 10, 2023

(30) Foreign Application Priority Data
Feb. 8, 2022   (KR) .......................... 10-2022-0016221

(51) Int. Cl.
*H10B 12/00* (2023.01)
*H01L 21/311* (2006.01)
(Continued)

(52) U.S. Cl.
CPC ..... *H10B 12/033* (2023.02); *H01L 21/76897* (2013.01); *H10B 12/09* (2023.02);
(Continued)

(58) Field of Classification Search
CPC ...... H10B 12/033; H10B 12/09; H10D 1/716; H10D 84/212; H01L 21/76897; H01L 21/31111
See application file for complete search history.

(56) References Cited

U.S. PATENT DOCUMENTS

| | | |
|---|---|---|
| 8,637,364 B2 | 1/2014 | Ueda |
| 8,912,629 B2 | 12/2014 | Seo |
| 8,927,384 B2 | 1/2015 | Kim et al. |

(Continued)

FOREIGN PATENT DOCUMENTS

| | | |
|---|---|---|
| CN | 112786595 A | 5/2021 |
| CN | 113270415 A | 8/2021 |

(Continued)

OTHER PUBLICATIONS

Taiwanese Office Action dated Dec. 12, 2023 for corresponding Taiwanese Patent Application No. 111129881.

(Continued)

*Primary Examiner* — Zandra V Smith
*Assistant Examiner* — Andre C Stevenson
(74) *Attorney, Agent, or Firm* — Harness, Dickey & Pierce, P.L.C.

(57) ABSTRACT

A semiconductor device includes first electrodes on a substrate and spaced apart from each other in a horizontal direction substantially parallel to an upper surface of the substrate, first support patterns contacting sidewalls of the first electrodes, a dielectric layer on surfaces of the first electrodes and the first support patterns, and a second electrode on the dielectric layer. The first support patterns are arranged in a first direction substantially parallel to the upper surface of the substrate, the first support patterns contact sidewalls of central portions of the first electrodes in a second direction substantially parallel to the upper surface of the substrate and substantially orthogonal to the first direction, and the first support patterns are not in contact with sidewalls of edge portions of the first electrodes in the second direction.

20 Claims, 31 Drawing Sheets

(51) Int. Cl.
  *H01L 21/768* (2006.01)
  *H10D 1/68* (2025.01)
  *H10D 84/00* (2025.01)

(52) U.S. Cl.
  CPC ........... *H10D 1/716* (2025.01); *H10D 84/212* (2025.01); *H01L 21/31111* (2013.01)

(56) References Cited

U.S. PATENT DOCUMENTS

| | | |
|---|---|---|
| 9,153,639 B2 | 10/2015 | Lee |
| 9,449,977 B2 | 9/2016 | Seo |
| 9,853,032 B2 | 12/2017 | Seo |
| 10,535,661 B2 | 1/2020 | Yokoyama |
| 11,355,497 B2 | 6/2022 | Son et al. |
| 11,424,202 B2 | 8/2022 | Choi et al. |
| 11,688,611 B2 | 6/2023 | Lai et al. |
| 2013/0292796 A1* | 11/2013 | Cho ....................... H10D 1/042 257/532 |
| 2019/0164985 A1* | 5/2019 | Lee ......................... H10D 1/714 |
| 2022/0216209 A1 | 7/2022 | Cho et al. |
| 2022/0231060 A1* | 7/2022 | Song ....................... H10F 39/014 |

FOREIGN PATENT DOCUMENTS

| | | |
|---|---|---|
| CN | 113540347 A | 10/2021 |
| KR | 10-2009-0001005 A | 1/2009 |
| KR | 2014/0048505 A | 4/2014 |
| KR | 101800419 B1 | 11/2017 |
| KR | 101901787 B1 | 9/2018 |
| KR | 10-2020-0130945 A | 11/2020 |
| TW | 202205684 A | 2/2022 |

OTHER PUBLICATIONS

Korean Office Action issued in Korean Patent Application No. 10-2022-0016221 dated Sep. 5, 2025.

* cited by examiner

FIG. 1
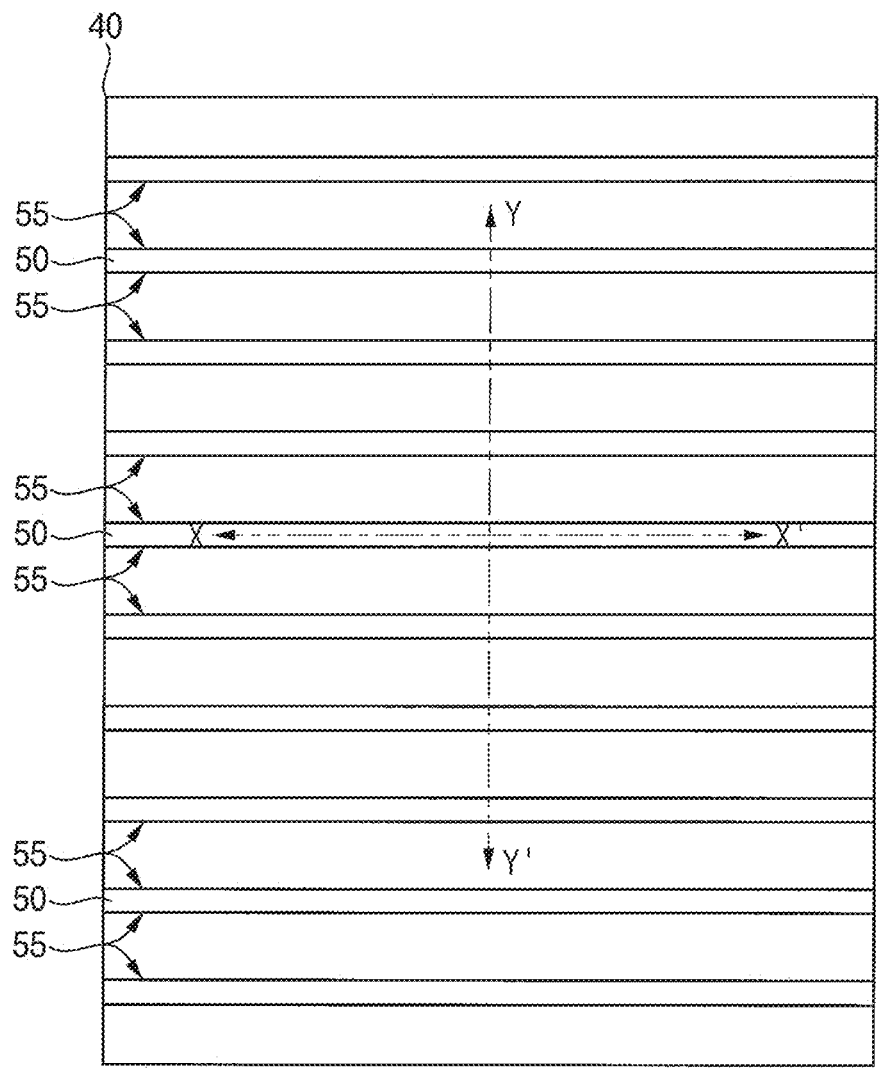
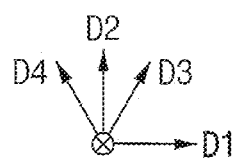

FIG. 4
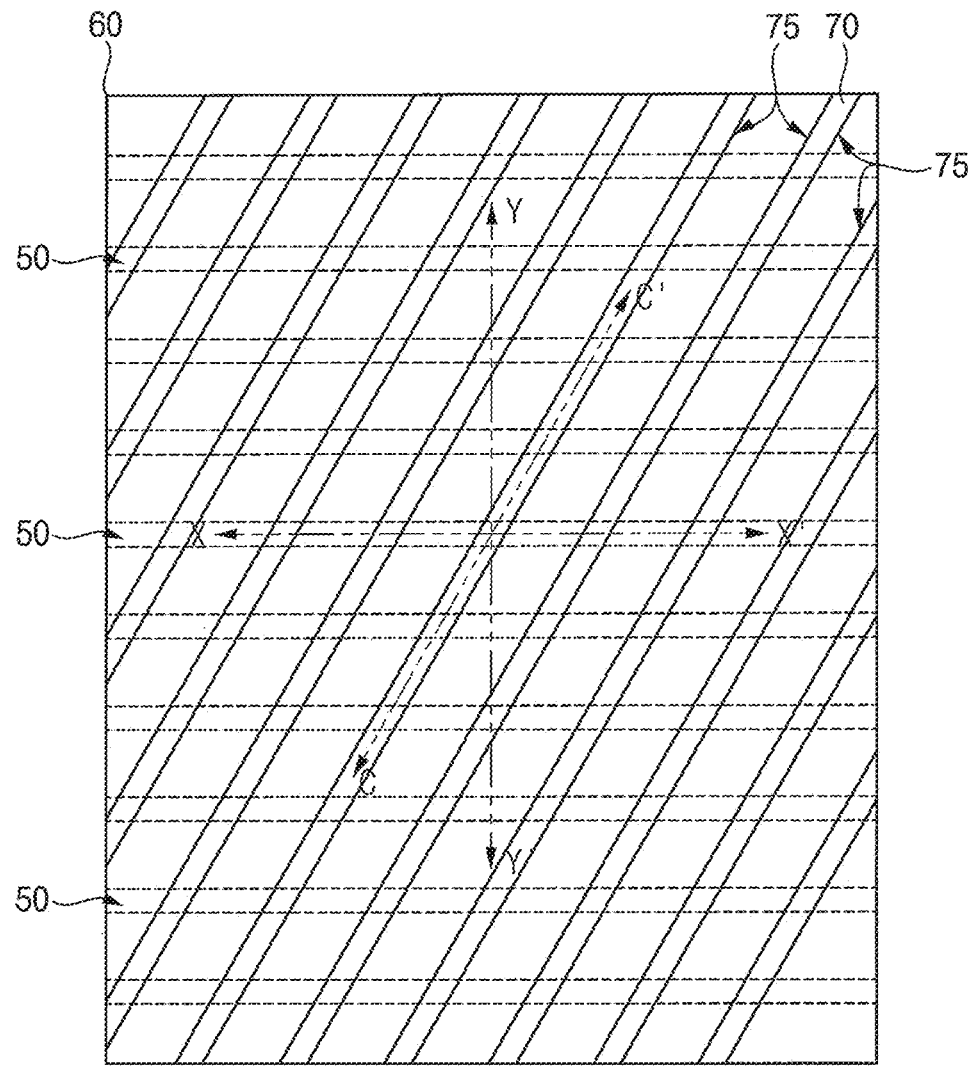
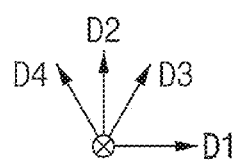

FIG. 8
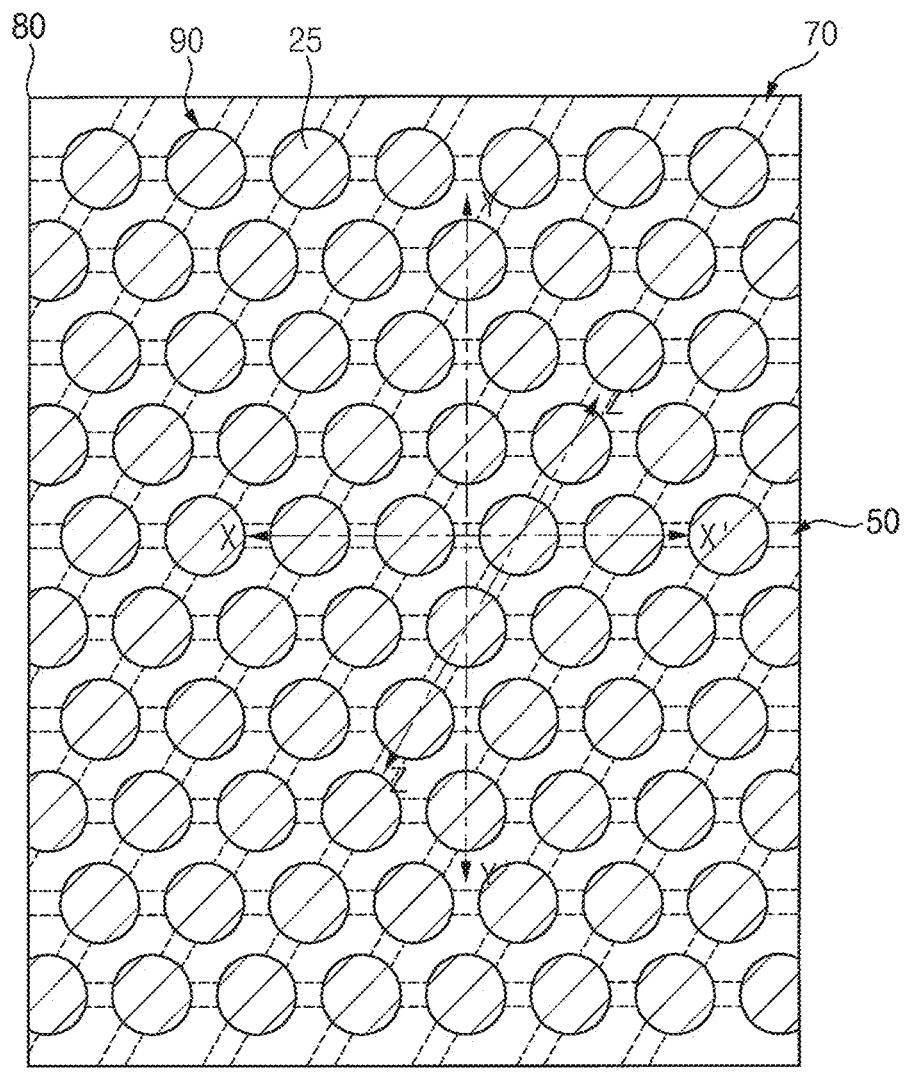
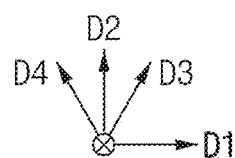

FIG. 24
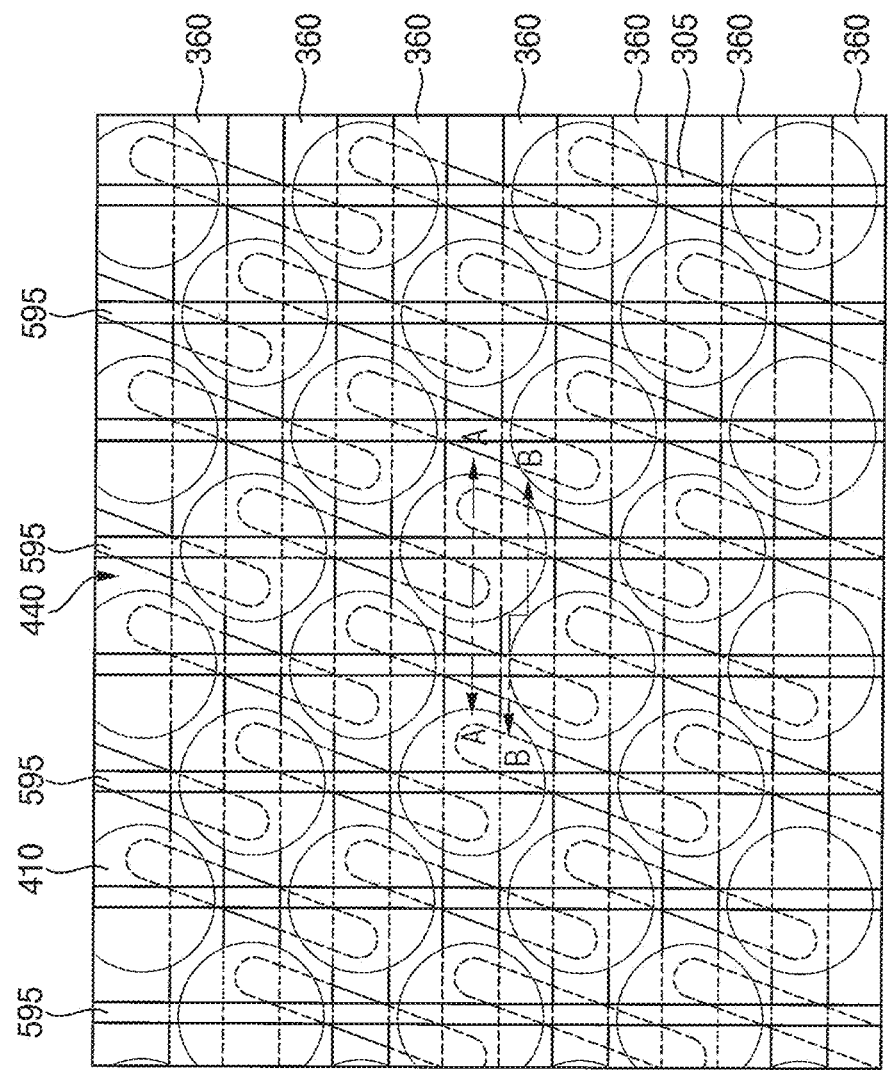
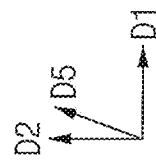

CAPACITOR STRUCTURE AND SEMICONDUCTOR DEVICE INCLUDING THE SAME

CROSS-REFERENCE TO RELATED APPLICATION

This application claims priority under 35 U.S.C. § 119 to Korean Patent Application No. 10-2022-0016221, filed on Feb. 8, 2022 in the Korean Intellectual Property Office, the disclosure of which is hereby incorporated by reference in its entirety.

TECHNICAL FIELD

Example embodiments relate to a capacitor structure and/or a semiconductor device including the same. More particularly, example embodiments relate to a capacitor structure and/or a DRAM device including the same.

DISCUSSION OF RELATED ART

As the aspect ratio of a lower electrode of a capacitor included in a DRAM device increases, it may be necessary to form a support pattern to support the lower electrode so that the lower electrode does not collapse. However, as the support pattern is formed, a portion of a surface of the lower electrode is covered by the support pattern so that the area of the surface of the lower electrode is reduced, and thus the electric capacity of the capacitor may decrease. In addition, the lower electrode may be partially damaged when the support pattern is formed.

SUMMARY

Example embodiments provide a capacitor structure and/or a semiconductor device having improved characteristics.

According to an example embodiment, a capacitor structure may include first electrodes on a substrate and spaced apart from each other in a horizontal direction parallel to an upper surface of the substrate; first support patterns contacting sidewalls of the first electrodes; a dielectric layer on surfaces of the first electrodes and surfaces of the first support patterns; and a second electrode on the dielectric layer. The first support patterns may be arranged in a first direction parallel to the upper surface of the substrate. The first support patterns may contact the sidewalls of the first electrodes at central portions of the first electrodes in a second direction. The second direction may be parallel to the upper surface of the substrate and orthogonal to the first direction. The first support patterns may not be in contact with the sidewalls of the first electrodes at edge portions of the first electrodes in the second direction.

According to an example embodiment, a capacitor structure may include first electrodes on a substrate and spaced apart from each other in a horizontal direction parallel to an upper surface of the substrate; first support patterns arranged in a first direction parallel to the upper surface of the substrate, the first support patterns contacting sidewalls of the first electrodes at central portions of the first electrodes in a vertical direction, the vertical direction being orthogonal to the upper surface of the substrate, and the first support patterns being spaced apart from each other by the first electrodes along the first direction; second support patterns arranged in a third direction parallel to the upper surface of the substrate, the third direction forming an acute angle with the first direction, the second support patterns contacting the sidewalls of the first electrodes at upper portions of the first electrodes in the vertical direction, the second support patterns being spaced apart from the first support patterns in the vertical direction, and the second support patterns being spaced apart from each other along the third direction; a dielectric layer on surfaces of the first electrodes, surfaces of the first support patterns, and surfaces of the second support patterns; and a second electrode on the dielectric layer.

According to an example embodiment, a semiconductor device may include an active pattern on a substrate; a gate structure extending in a first direction parallel to an upper surface of the substrate and buried in an upper portion of the active pattern; a bit line structure extending in a second direction parallel to the upper surface of the substrate and orthogonal to the first direction, the bit line being on a central portion of the active pattern; a contact plug structure on each of opposite ends of the active pattern; and a capacitor structure on the contact plug structure. The capacitor structure may include first electrodes on the substrate and spaced apart from each other in a horizontal direction parallel to the upper surface of the substrate, each of the first electrodes being in contact with an upper surface of the contact plug structure; first support patterns contacting sidewalls of the first electrodes; a dielectric layer on surfaces of the first electrodes and surfaces of the first support patterns; and a second electrode on the dielectric layer. The first support patterns may be arranged in a third direction parallel to the upper surface of the substrate. The first support patterns may be in contact with the sidewalls of the first electrodes at central portions of the first electrodes in a fourth direction. The fourth direction may be parallel to the upper surface of the substrate and orthogonal to the third direction. The first support patterns may not be in contact with the sidewalls of the first electrodes at edge portions of the first electrodes in the fourth direction.

In some example embodiments, the lower electrodes of the capacitor structure may be supported by the support patterns symmetrically formed along the horizontal direction, so as not to collapse or bend even with a high aspect ratio. Additionally, the upper portions of the lower electrodes may not be partially removed during the process of forming the support patterns, and the areas of the surfaces of the lower electrodes covered by the support patterns may be reduced and/or minimized, so that the capacitor structure may have a high capacitance.

BRIEF DESCRIPTION OF THE DRAWINGS

FIGS. 1 to 18 are plan views and cross-sectional views illustrating a method of forming a capacitor structure device in accordance with some example embodiments.

FIGS. 19 to 35 are plan views and cross-sectional views illustrating a method of manufacturing a semiconductor device in accordance with some example embodiments.

DETAILED DESCRIPTION

Figure 2:
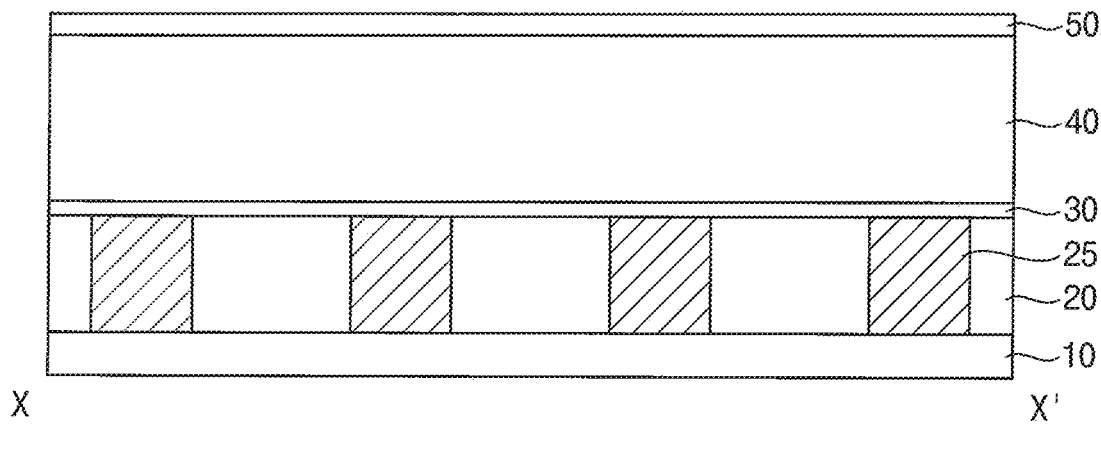

The above and other aspects and features of the capacitor structures and the methods of manufacturing the same, the semiconductor devices including the capacitor structures and the methods of manufacturing the same in accordance with example embodiments will become readily understood from the description that follows with reference to the accompanying drawings.

It will be understood that, although the terms "first," "second," and/or "third" may be used herein to describe various materials, layers, regions, pads, electrodes, patterns, structure and/or processes, these various materials, layers, regions, pads, electrodes, patterns, structure and/or processes should not be limited by these terms. These terms are only used to distinguish one material, layer, region, pad, electrode, pattern, structure or process from another material, layer, region, pad, electrode, pattern, structure or process. Thus, "first", "second" and/or "third" may be used selectively or interchangeably for each material, layer, region, electrode, pad, pattern, structure or process respectively.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

FIGS. 1 to 18 are plan views and cross-sectional views illustrating a method of forming a capacitor structure according to some example embodiments. Specifically, FIGS. 1, 4, 8 and 12 are the plan views, FIGS. 2, 5, 9, 13 and 16 are cross-sectional views taken along lines X-X' of corresponding plan views, respectively, and FIGS. 3, 6, 10, and 14 and 17 are cross-sectional views taken along lines Y-Y' of corresponding plan views, respectively, and FIGS. 7, 11, 15 and 18 are cross-sectional views taken along lines Z-Z' of corresponding plan views, respectively.

Hereinafter, two directions substantially parallel to an upper surface of a substrate 10 and substantially orthogonal to each other may be defined as first and second directions D1 and D2, respectively, and a direction substantially parallel to the upper surface of the substrate 10 and having an acute angle with each of the first and second directions D1 and D2 may be defined as a third direction D3. In some example embodiments, the third direction D3 may form an angle of 60 degrees with the first direction D1, but inventive concepts are not limited thereto. A direction substantially parallel to the upper surface of the substrate 10 and substantially orthogonal to the third direction D3 may be defined as a fourth direction D4.

Figure 3:
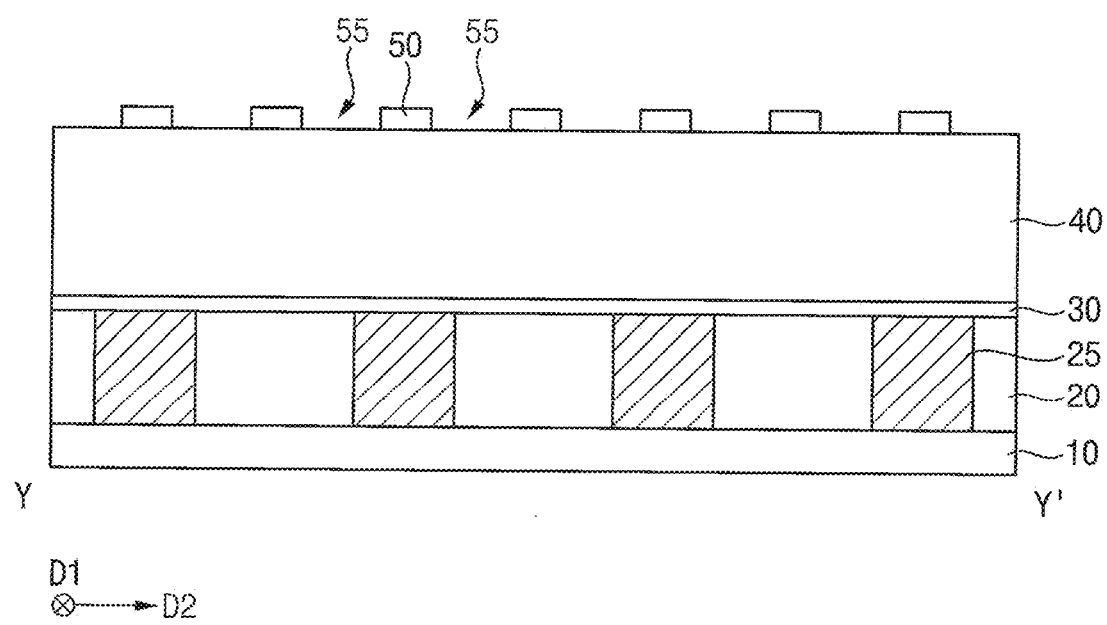
Figure 5:
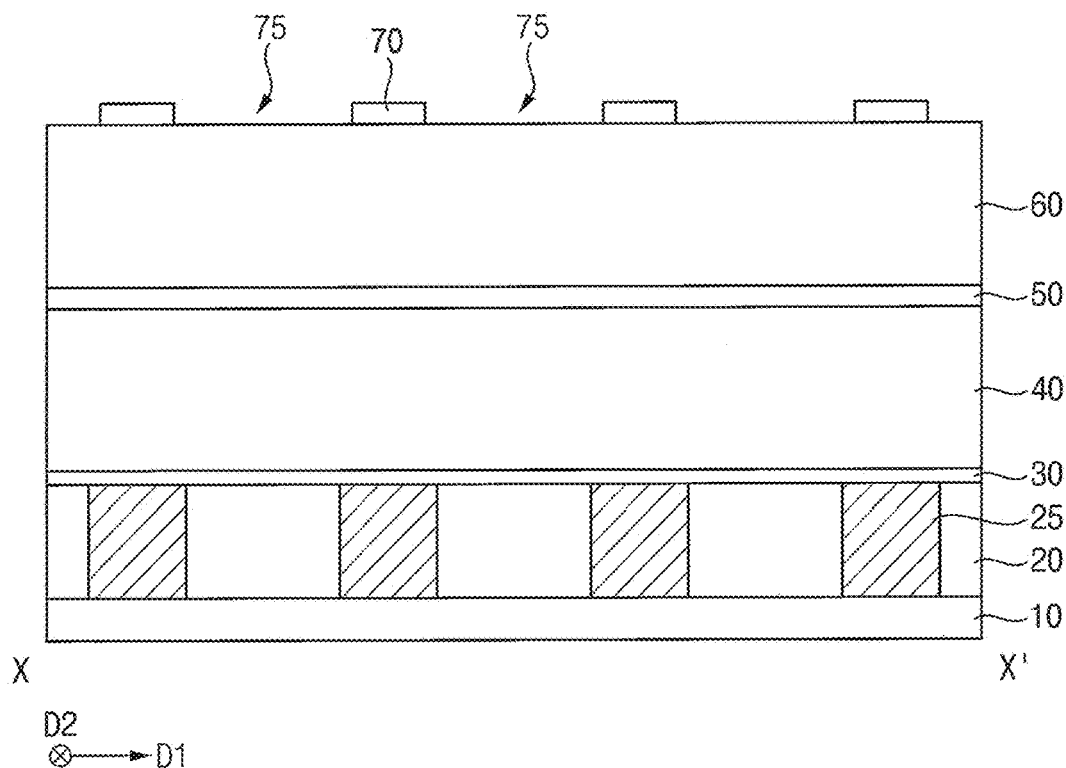
Figure 6:
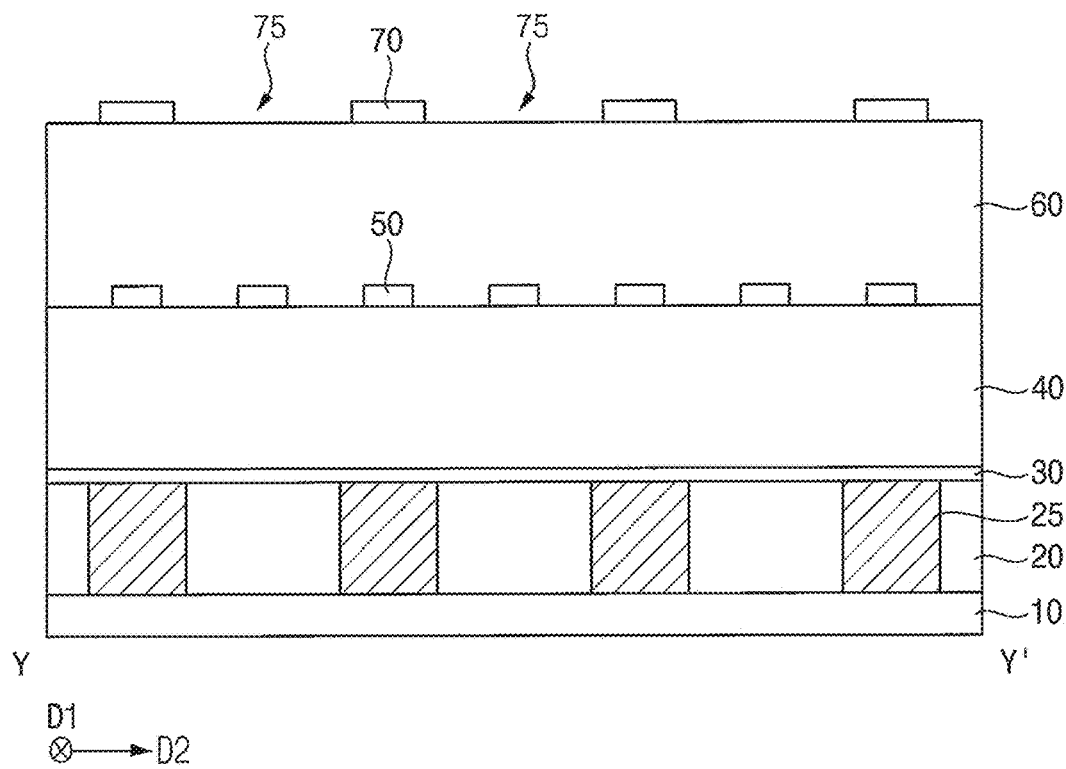
Figure 7:
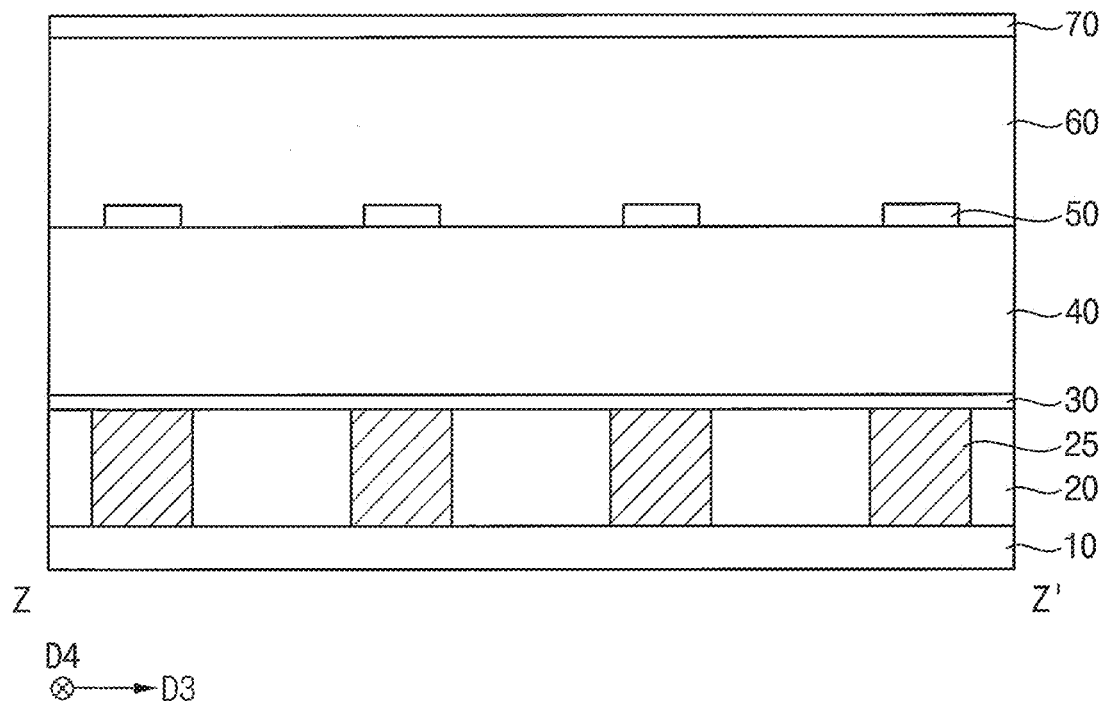
Figure 9:
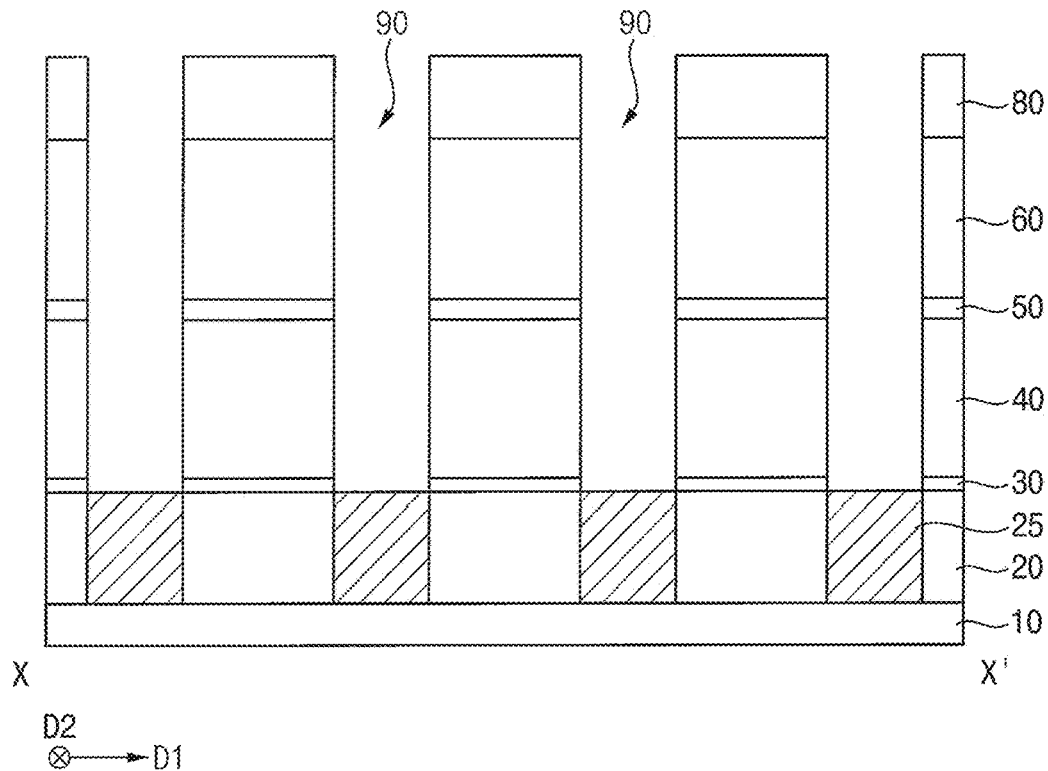
Figure 10:
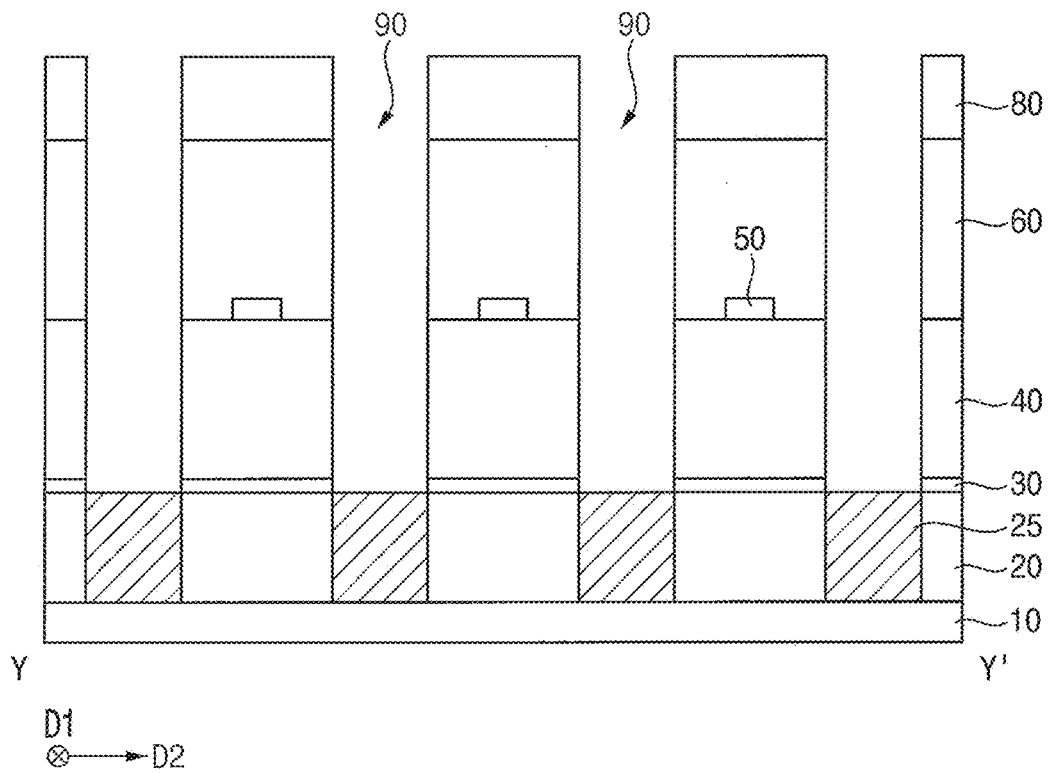
Figure 11:
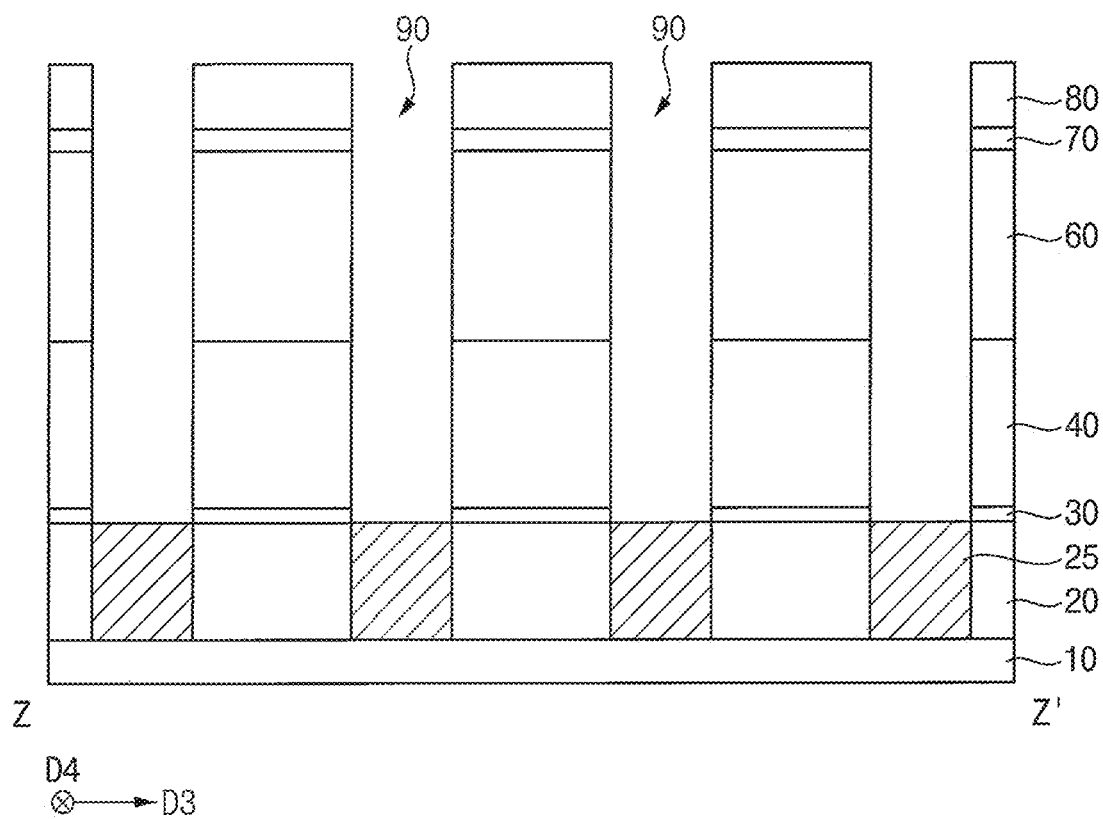

Referring to FIGS. 1 to 3, an insulating interlayer 20 containing a conductive pattern 25 may be formed on the substrate 10, an etch stop layer 30, a first mold layer 40 and a first support layer may be sequentially formed on the conductive pattern 25 and the insulating interlayer 20, and the first support layer may be patterned to form a first supporting pattern 50.

The substrate 10 may include silicon, germanium, silicon-germanium, or a III-V group compound semiconductor, such as GaP, GaAs, or GaSb. In some example embodiments, the substrate 10 may be a silicon-on-insulator (SDI) substrate or a germanium-on-insulator (GOI) substrate.

The conductive pattern 25 may include, for example, a metal, a metal nitride, a metal silicide, or polysilicon doped with impurities. The conductive pattern 25 may include, for example, a contact plug, a landing pad, or the like.

The insulating interlayer 20 may include, for example, an insulating material such as silicon oxide, silicon nitride, or a low-k material. The etch stop layer 30 may include a nitride, e.g., silicon boron nitride (SiBN) or silicon carbonitride (SiCN).

The first mold layer 40 may include, for example, an oxide such as silicon oxide, and the first support layer may include, for example, a nitride such as silicon carbonitride or silicon nitride.

In some example embodiments, the first support pattern 50 may extend in the first direction D1, and a plurality of first support patterns 50 may be spaced apart from each other in the second direction D2. A first opening 55 exposing a top surface of the first mold layer 40 may be formed between ones of the first support patterns 50 adjacent to each other in the second direction D2.

In some example embodiments, the first support patterns 50 may be formed by patterning the first support layer through a double patterning process or a quadruple patterning process.

Referring to FIGS. 4 to 7, a second mold layer 60 and a second support layer may be sequentially formed on the first support pattern 50 and the first mold layer 40, and the second support layer may be patterned to form a second support pattern 70.

The second mold layer 60 may include, for example, an oxide such as silicon oxide, and the second support layer may include, for example, a nitride such as silicon carbonitride or silicon nitride.

In some example embodiments, the second support pattern 70 may extend in the third direction D3, and a plurality of second support patterns 70 may be spaced apart from each other in the fourth direction D4. A second opening 75 exposing a top surface of the second mold layer 60 may be formed between ones of the second support patterns 70 adjacent to each other in the fourth direction D4.

In some example embodiments, the second support patterns 70 may be formed by patterning the second support layer through a double patterning process or a quadruple patterning.

Referring to FIGS. 8 to 11, a third mold layer 80 may be formed on the second support pattern 70 and the second mold layer 60, an etch mask may be formed on the third mold layer 80, and the first to third mold layers 40, 60 and 80, the first and second support patterns 50 and 70, and the etch stop layer 30 may be etched using the etch mask to form a third opening 90 exposing an upper surface of the conductive pattern 25.

The third mold layer 80 may include, for example, an oxide such as silicon oxide, and the etch mask may include, for example, a photoresist pattern.

In some example embodiments, the third opening 90 may have a shape of a circle, an ellipse, or a rounded polygon, and a plurality of third openings 90 may be arranged in a honeycomb pattern, in a plan view.

In some example embodiments, the third opening 90 may penetrate portions of the first and second support patterns 50 and 70 that may overlap each other in a vertical direction substantially orthogonal to the upper surface of the substrate 10. Accordingly, a plurality of third openings 90 may be spaced apart from each other in the first direction D1, and may penetrate the first support pattern 50 extending in the first direction D1. Additionally, a plurality of third openings 90 may be spaced apart from each other in the third direction D3, and may penetrate the second support pattern 70 extending in the third direction D3.

Referring to FIGS. 12 to 15, a first electrode 100 may be formed in each of the third openings 90.

The first electrode 100 may be formed by forming a first electrode layer on the upper surface of the conductive pattern 25 and an upper surface of the third mold layer 80 to fill the third openings 90, and planarizing the first electrode layer until the upper surface of the third mold layer 80 is exposed.

The first electrode 100 may include, for example, a metal, a metal nitride, a metal silicide, polysilicon doped with impurities, etc.

The first to third mold layers 40, 60 and 80 may be removed by, for example, a wet etching process. Accordingly, a fourth opening 110 exposing an upper surface of the etch stop layer 30 and surfaces of the first and second support patterns 50 and 70 may be formed between the first electrodes 100.

In some example embodiments, the first support pattern 50 may contact each of opposite sidewalls in the first direction D1 of a central portion in the vertical direction of each of the first electrodes 100, and a plurality of first support patterns 50 may be spaced apart from each other by the first electrodes 100 in the first direction D1. Accordingly, the opposite sidewalls in the first direction D1 of the central portion in the vertical direction of each of the first electrodes 100 may contact the first support patterns 50, respectively, and the first support patterns 50 may be symmetrical with respect to each of the first electrodes in the first direction D1.

In some example embodiments, the second support pattern 50 may contact each of opposite sidewalls in the third direction D3 of an upper portion in the vertical direction of each of the first electrodes 100, and a plurality of second support patterns 50 may be spaced apart from each other by the first electrodes 100 in the first direction D3. Accordingly, the opposite sidewalls in the third direction D3 of the upper portion in the vertical direction of each of the first electrodes 100 may contact the second support patterns 50, respectively, and the second support patterns 50 may be symmetrical with respect to each of the first electrodes in the third direction D3.

Figure 16:
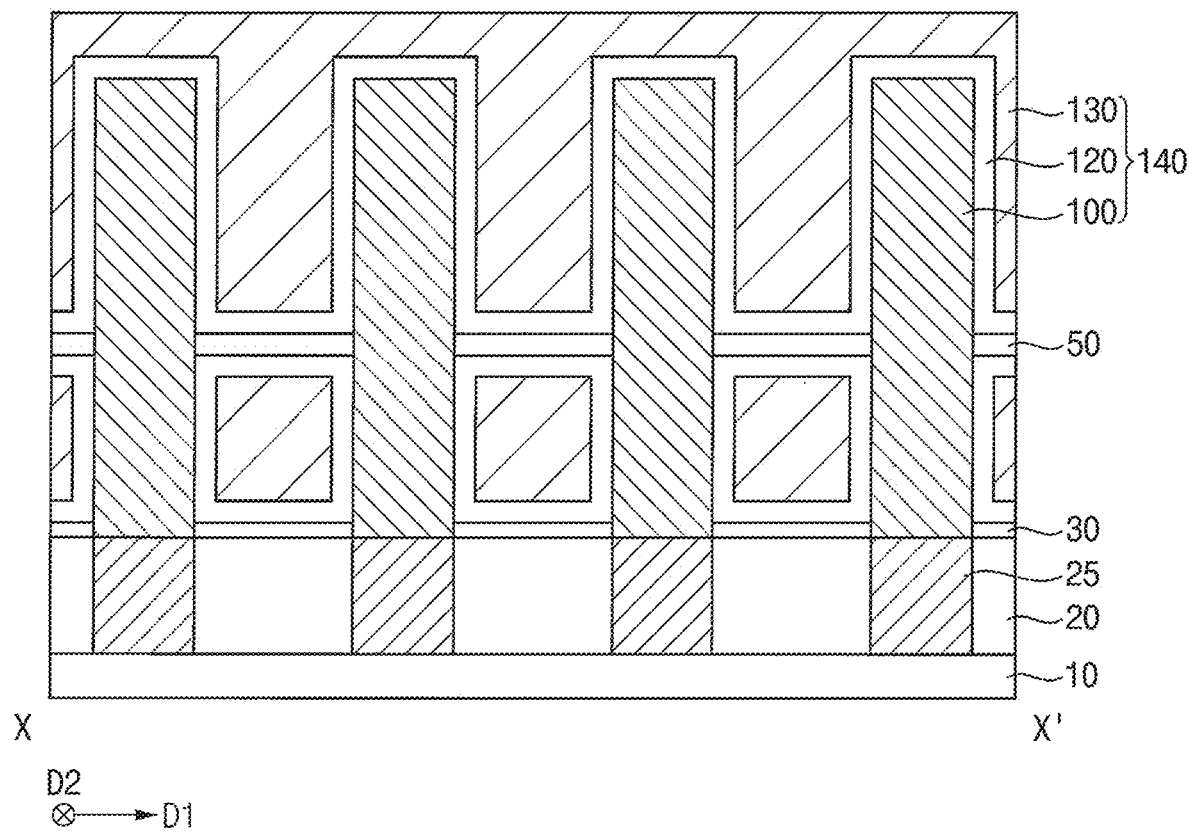
Figure 17:
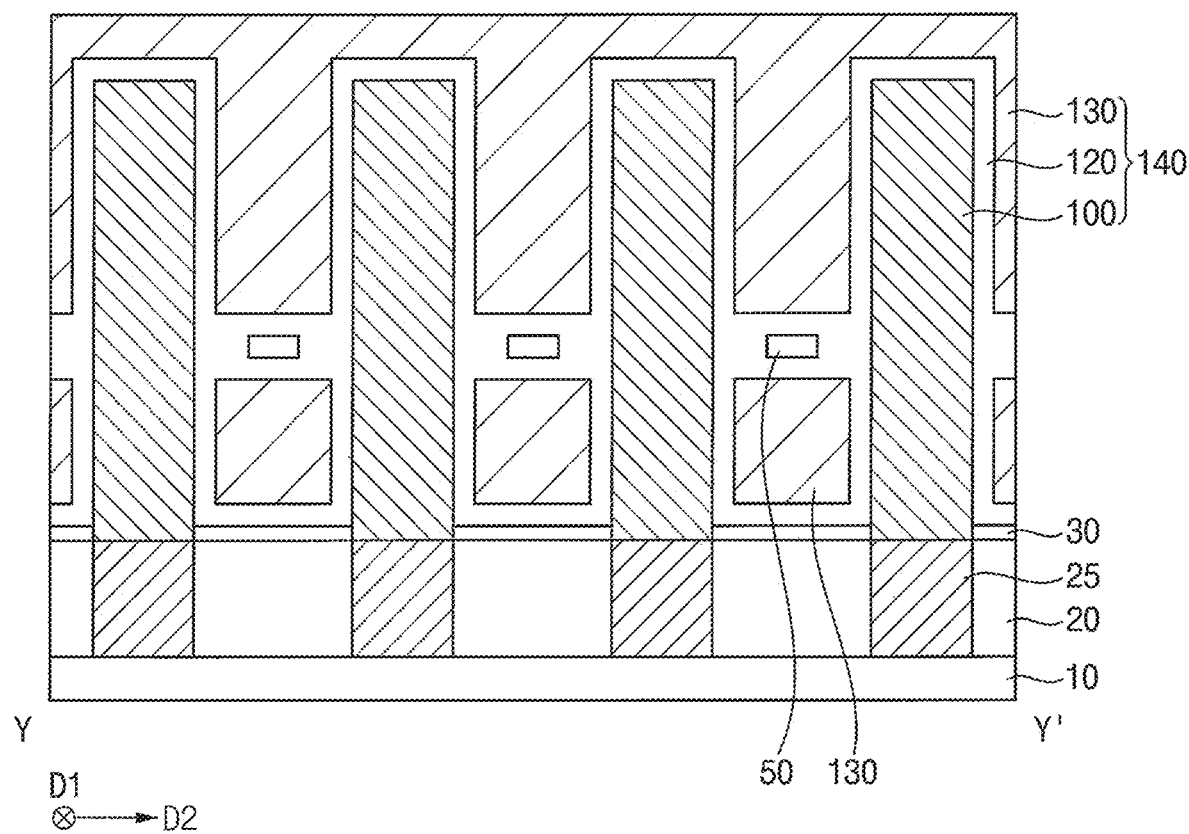
Figure 18:
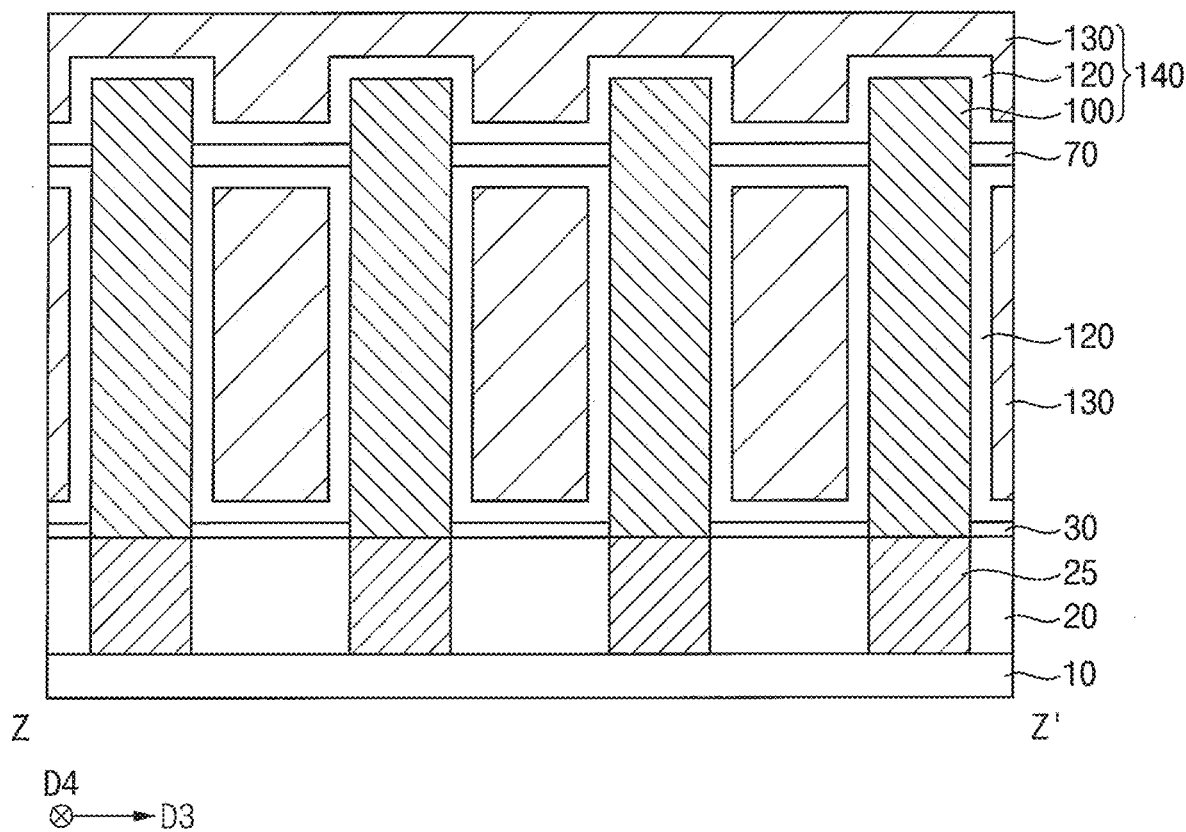

Referring to FIGS. 16 to 18, a dielectric layer 120 may be formed on the upper surface of the etch stop layer 30 and the surfaces of the first and second support patterns 50 and 70 exposed by the fourth opening 110, and sidewalls and top surfaces of the first electrodes 100, and a second electrode 130 may be formed on the dielectric layer 120 to fill the fourth opening 110.

The dielectric layer 120 may include, for example, a metal oxide, and the second electrode 130 may include a metal, a metal nitride, a metal silicide, or silicon-germanium (SiGe) doped with impurities.

The first electrode 100, the dielectric layer 120, and the second electrode 130 may form a capacitor 140, and the first and second electrodes 100 and 130 may be referred to as a lower electrode and an upper electrode, respectively.

The capacitor structure may be formed by the above-described processes.

As described above, the first and second support patterns 50 and 70 may be formed to support the first electrodes 100 having a high aspect ratio, so as to limit and/or prevent the first electrodes 100 from collapsing. The first and second support patterns 50 and 70 may be formed by forming the first and second support layers on the first and second mold layers 40 and 60 respectively, and performing, for example, a double patterning process or a quadruple process on the first and second support layers.

For example, if, after forming the first electrodes 100, the first and second support layers are patterned by an etching process to form the first and second support patterns 50 and 70, respectively, during the etching process, upper portions of the first electrodes 100 may be partially removed or damaged, and accordingly, the capacitance of the capacitor 140 including the first electrode 100 may be reduced. However, in some example embodiments, the first electrodes 100 may be formed, after forming the first and second support patterns 50 and 70 by patterning the first and second support layers, the upper portions of the first electrodes 100 may not be removed or damaged during the process of forming the first and the second support patterns 50 and 70, and thus the capacitance of the capacitor including the first electrode 100 may not be reduced.

For example, if, after forming the first electrodes 100, the support patterns are formed by partially removing the support layers on the sidewalls of the first electrodes 100, the support patterns on the sidewalls of each of the first electrodes 100 may not be symmetrical with respect to each of the first electrodes. When the dielectric layer 120 is formed on the surfaces of the first electrodes 100 and the support patterns, the surfaces of the first electrodes 100 are oxidized to form an oxide layer. Portions of each of the first electrodes 100 which are not covered by the support patterns are asymmetric, and thus the oxide layer is asymmetrically formed on the surface of each of the first electrodes 100. Accordingly, the compressive stress that may be applied to each of the first electrodes 100 by the oxide layer may be unbalanced, which may cause the first electrodes 100 to bend.

However, in some example embodiments, the first support patterns 50 may be symmetrically formed on the opposite sidewalls, respectively, in the first direction D1 of the central portion in the vertical direction of each of the first electrodes 100, and the second support patterns 70 may be symmetrically formed on the opposite sidewalls, respectively, in the third direction D3, of the upper portion in the vertical direction of each of the first electrodes 100. Thus, when the dielectric layer 120 is formed on the surfaces of the first and second support patterns 50 and 70, the oxide layer on the surfaces of the first electrodes 100 may be symmetrical with respect to each of the first electrodes 100, so that the compressive stress applied to each of the first electrodes 100 by the oxide layer may be balanced. Accordingly, the first electrodes 100 may not be bent by the process of forming the dielectric layer 120.

Furthermore, each of the first and second support patterns 50 and 70 may be formed on the surface of each of the first electrodes 100 to have a linear shape in a horizontal direction substantially parallel to the upper surface of the substrate 10, and thus areas of the surface of each of the first electrodes 100 covered by the first and second support patterns 50 and 70 may be reduced and/or minimized. Accordingly, the reduction of the capacitance of the capacitor 140 including the first electrode 100 that may be caused by the first and second support patterns 50 and 70 may be reduced and/or minimized.

The first and second support patterns 50 and 70 may extend in the first and third directions D1 and D3, respectively, so as to support the first electrodes 100 in different directions from each other, and thus the collapse of the first electrodes 100 may be effectively limited and/or prevented.

The capacitor structure may have following structural characteristics.

Particularly, the capacitor structure may include the first electrodes 100 on the substrate 10 and spaced apart from each other in the horizontal direction, the first support patterns 50 arranged in the first direction D1 to contact the sidewalls of the central portions in the vertical direction of the first electrodes 100 and spaced apart from each other by the first electrodes 100 along the first direction D1, the second support patterns 70 arranged in the third direction D3 to contact the sidewalls of the upper portions in the vertical direction of the first electrodes 100 and spaced apart from each other by the first electrodes 100 along the third direction D3, the dielectric layer 120 on the surfaces of the first electrodes 100 and surfaces of the first and second support patterns 50 and 70, and the second electrode 130 on the dielectric layer 120.

In some example embodiments, the first support patterns 50 may contact sidewalls of central portions in the second direction D2 of the first electrodes in a plan view, but may not contact sidewalls of edge portions in the second direction D2 of the first electrodes 100 in a plan view. In addition, the second support patterns 70 may contact sidewalls of central portions in the fourth direction D4 of the first electrodes 100 in a plan view, but may not contact edge portions in the fourth direction D4 of the first electrodes 100 in a plan view.

For example, referring to FIGS. 12 to 15, the first support patterns 50 may contact the sidewalls of the first electrodes 100 at central portions of the first electrodes in a second direction CP_D2, and the first support patterns 50 may not be in contact with (e.g., direct contact with) the sidewalls of the first electrodes at edge portions of the first electrodes in the second direction EP_D2. The second support patterns 70 may be in contact with the sidewalls of the first electrodes 100 at central portions of the first electrodes in a fourth direction CP_D4 and the second support patterns 70 may not be in contact with the sidewalls of the first electrodes 100 at edge portions of the first electrodes in the fourth direction EP_D4.

Each first electrode 100 may be between a pair of the first support patterns 50 contacting opposite locations, respectively, in the first direction D1 of the first electrode 50 therebetween. The pair of first support patterns 50 may be symmetrical in the first direction D1 with respect to the first electrode 100 therebetween. Each one of the first electrodes 100 may be between a pair of the second support patterns 70 contacting opposite locations, respectively, in the third direction D3 of the first electrode therebetween. The pair of second support patterns 70 may be symmetrical in the third direction D3 with respect to the first electrode 100 therebetween.

Figure 12:
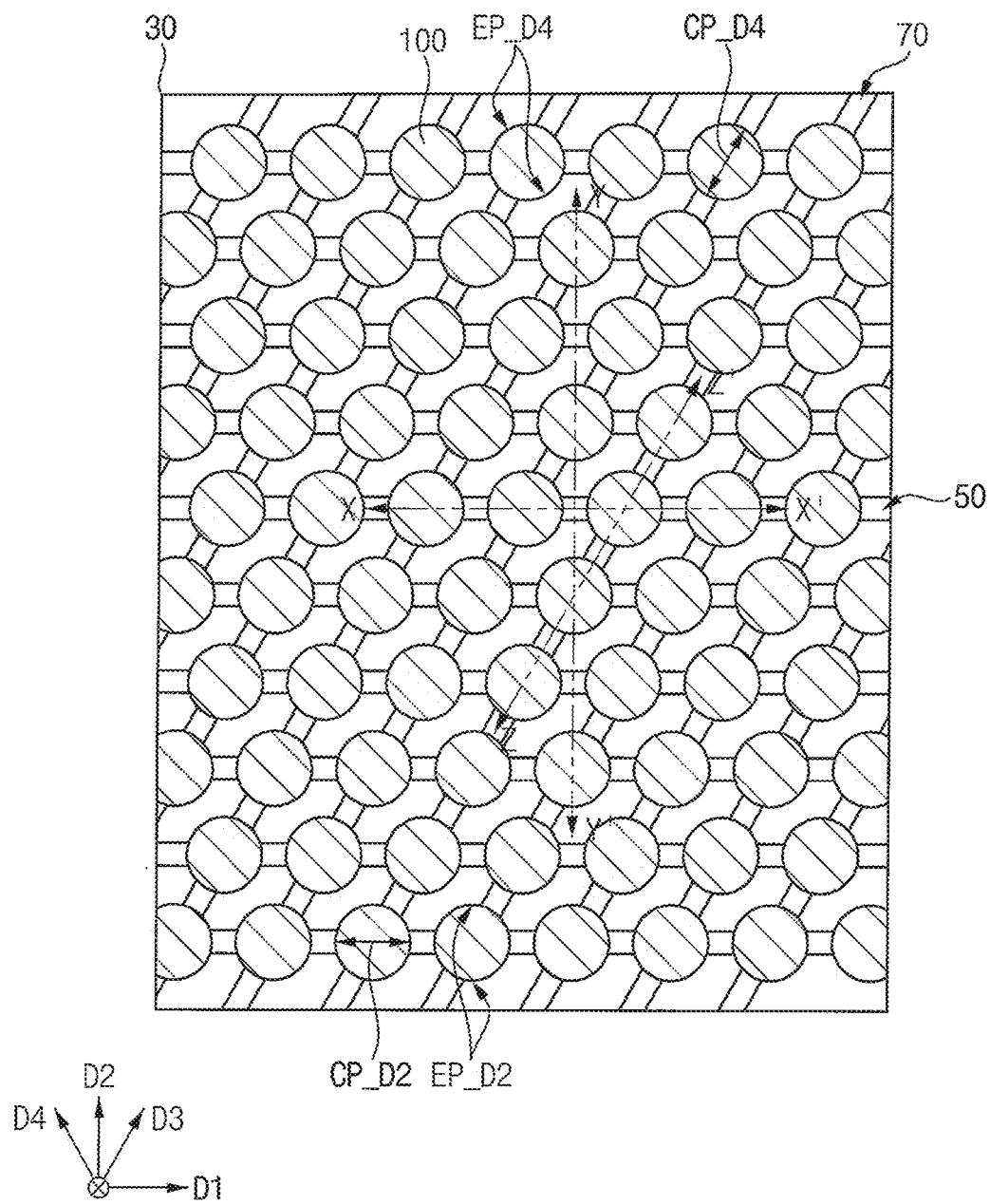
Figure 13:
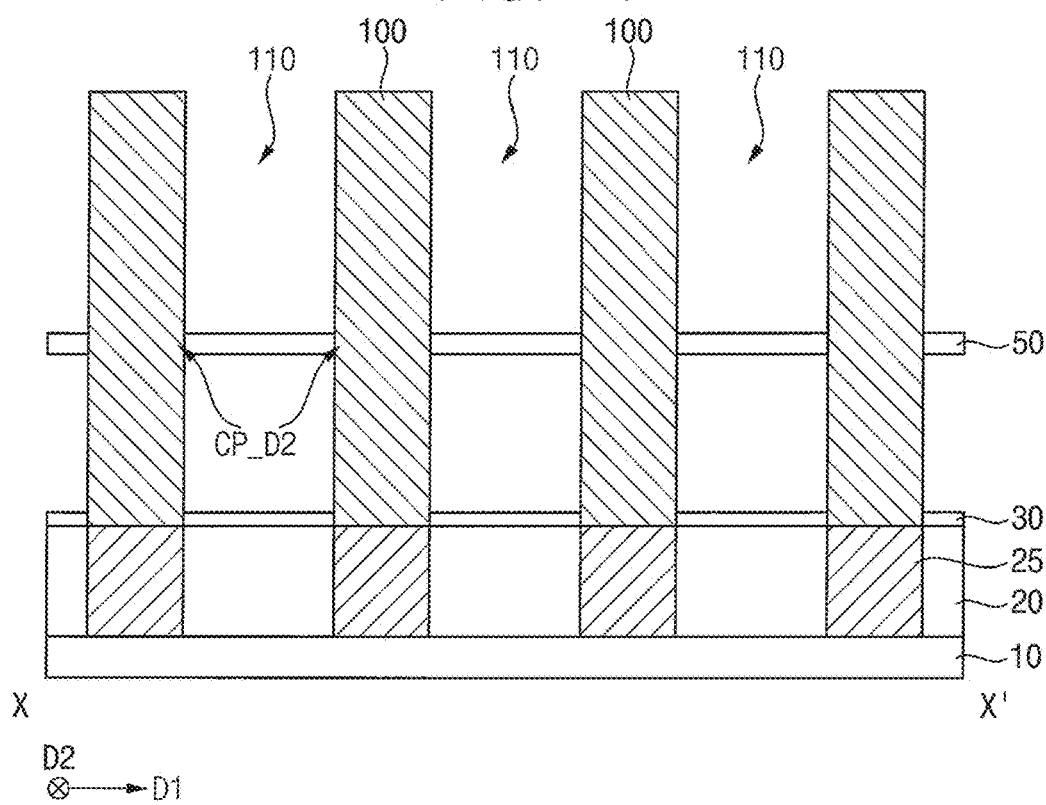
Figure 14:
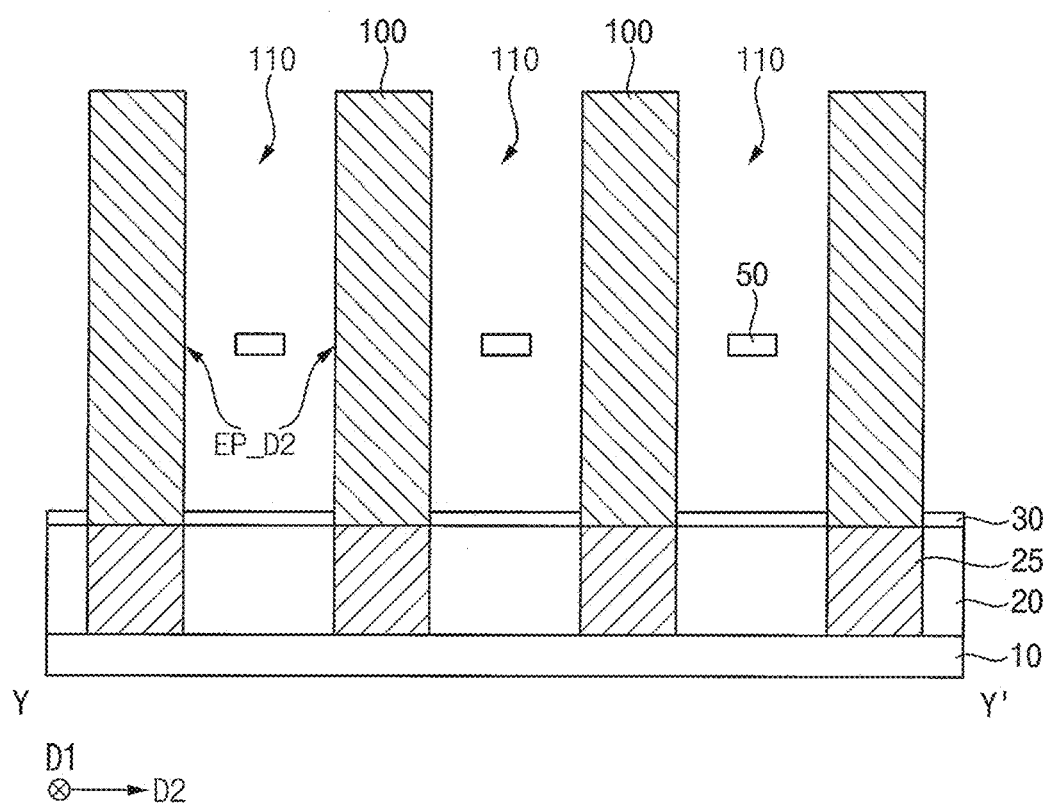
Figure 15:
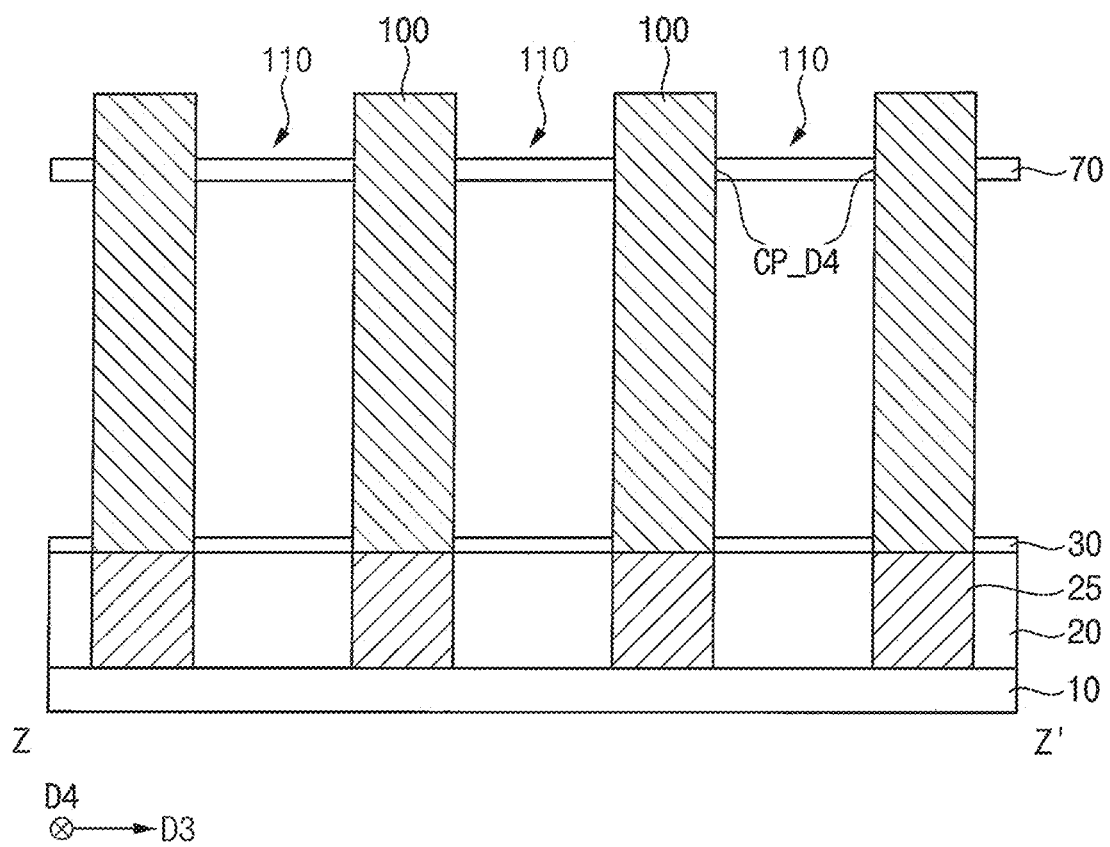

The sidewalls of the first electrode 100 may also be referred to as a lateral surface of the first electrode 100. As shown in FIG. 12, the first support patterns 50 and the second support patterns 70 may be radially aligned to different locations along the lateral surface of the first electrode 100. The central portions of the first electrodes in the second direction CP_D2 and central portions of the first electrodes in the fourth direction CP_D4 may be radially apart from each other by an angle (e.g., 60 degrees) along the lateral surface of the first electrode 100. The central portions of the first electrodes in the second direction CP_D2 and the central portions of the first electrodes in the fourth direction CP_D4 both may be radially apart from the edge portions of the first electrodes in the second direction EP_D2 and the edge portions of the first electrodes in the fourth direction EP_D4 at angles along the lateral surface of the first electrode 100.

In some example embodiments, each of the first support patterns 50 may have a bar shape extending in the first direction D1, and each of the second support patterns 70 may have a bar shape extending in the third direction D3.

In some example embodiments, the first support patterns 50 may have the same width in the second direction D2, and the second support patterns 70 may have the same width in the fourth direction D4.

In some example embodiments, ones of the first support patterns 50 contacting opposite sidewalls, respectively, in the first direction D1 of each of the first electrodes 100 may be symmetrical with respect to each of the first electrodes 100, and ones of the second support patterns 70 contacting opposite sidewalls, respectively, in the third direction D3 of each of the first electrodes 100 may be symmetrical with respect to each of the first electrodes 100.

In some example embodiments, each of the first electrodes 100 may have a pillar shape extending in the vertical direction. However, inventive concept is not necessarily limited thereto, and each of the first electrodes 100 may have a cup shape or a hollow cylinder shape with a closed bottom.

FIGS. 19 to 35 are plan views and cross-sectional views illustrating a method of manufacturing a semiconductor device according to some example embodiments. Specifically, FIGS. 19, 21, 24 and 32 are the plan views, and each of FIGS. 20, 22-23, 25-27, 29-31, 33-34 and 35 includes cross-sectional views taken along lines A-A' and B-B', respectively, of corresponding plan views.

The method of manufacturing the semiconductor device is an application of the method of forming the capacitor structure described with reference to FIGS. 1 to 18 to a method of manufacturing a DRAM device, and repeated explanations of the method of forming the capacitor structure are omitted herein.

Hereinafter, two directions substantially parallel to an upper surface of a substrate 300 and substantially orthogonal to each other may be referred as first and second directions D1 and D2, respectively, and a direction substantially parallel to the upper surface of the substrate 300 and having an acute angle with respect to each of the first and second directions D1 and D2 may be referred to as a fifth direction D5. The first and second directions D1 and D2 illustrated in FIGS. 19 to 35 may be the same as or different from the first and second directions D1 and D2, respectively, illustrated in FIGS. 1 to 18.

Figure 19:
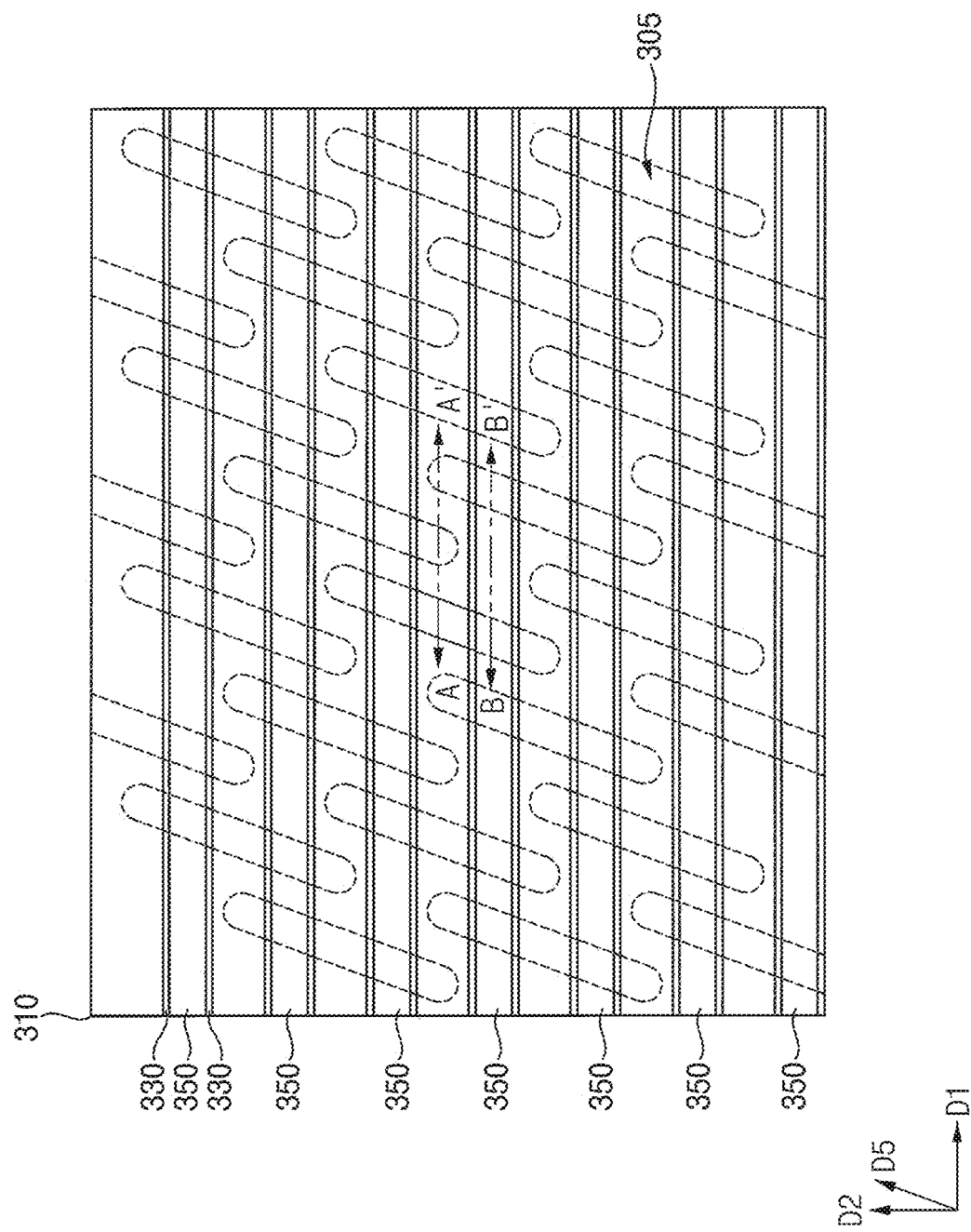
Figure 20:
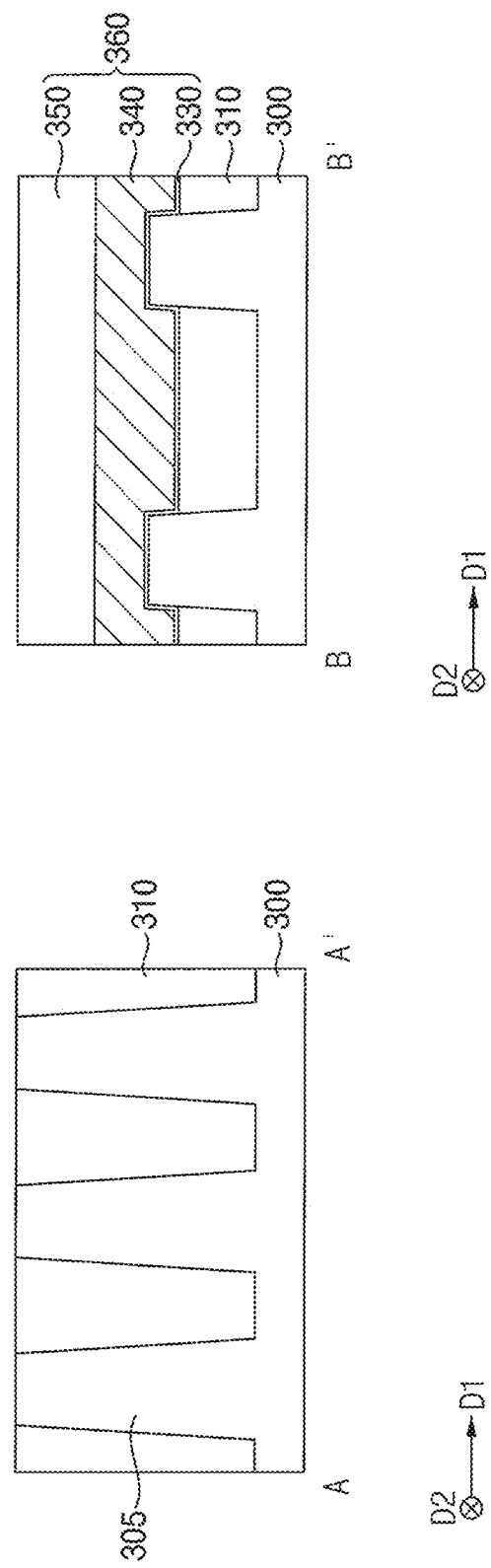

Referring to FIGS. 19 to 20, an upper portion of the substrate 300 may be removed to form a first recess, and an isolation pattern 310 may be formed in the first recess.

As the isolation pattern 310 is formed on the substrate 300, an active pattern 305 of which a sidewall is covered by the isolation pattern 310 may be defined. The active pattern 305 may extend in the fifth direction D5 and a plurality of active patterns 305 may be spaced apart from each other in the first and second directions D1 and D2. The isolation pattern 310 may include, for example, an oxide such as silicon oxide.

The active pattern 305 and the isolation pattern 310 on the substrate 300 may be partially etched to form a second recess extending in the first direction D1, and a gate structure 360 may be formed in the second recess. The gate structure 360 may include a gate insulation pattern 330 on a bottom and a sidewall of the second recess, and a gate electrode 340 on a portion of the gate insulation pattern 330 on the bottom and a lower sidewall of the second recess, and a gate mask 350 on the gate electrode 340 and filling a upper portion of the second recess.

The gate insulation pattern 330 may include, for example, an oxide such as silicon oxide, the gate electrode 340 may include a metal, a metal nitride, a metal silicide, or polysilicon doped with impurities, and the gate mask 350 may include, for example, a nitride such as silicon nitride.

In some example embodiments, the gate structure 360 may extend in the first direction D1, and a plurality of gate structures may be spaced apart from each other in the second direction D2.

Figure 21:
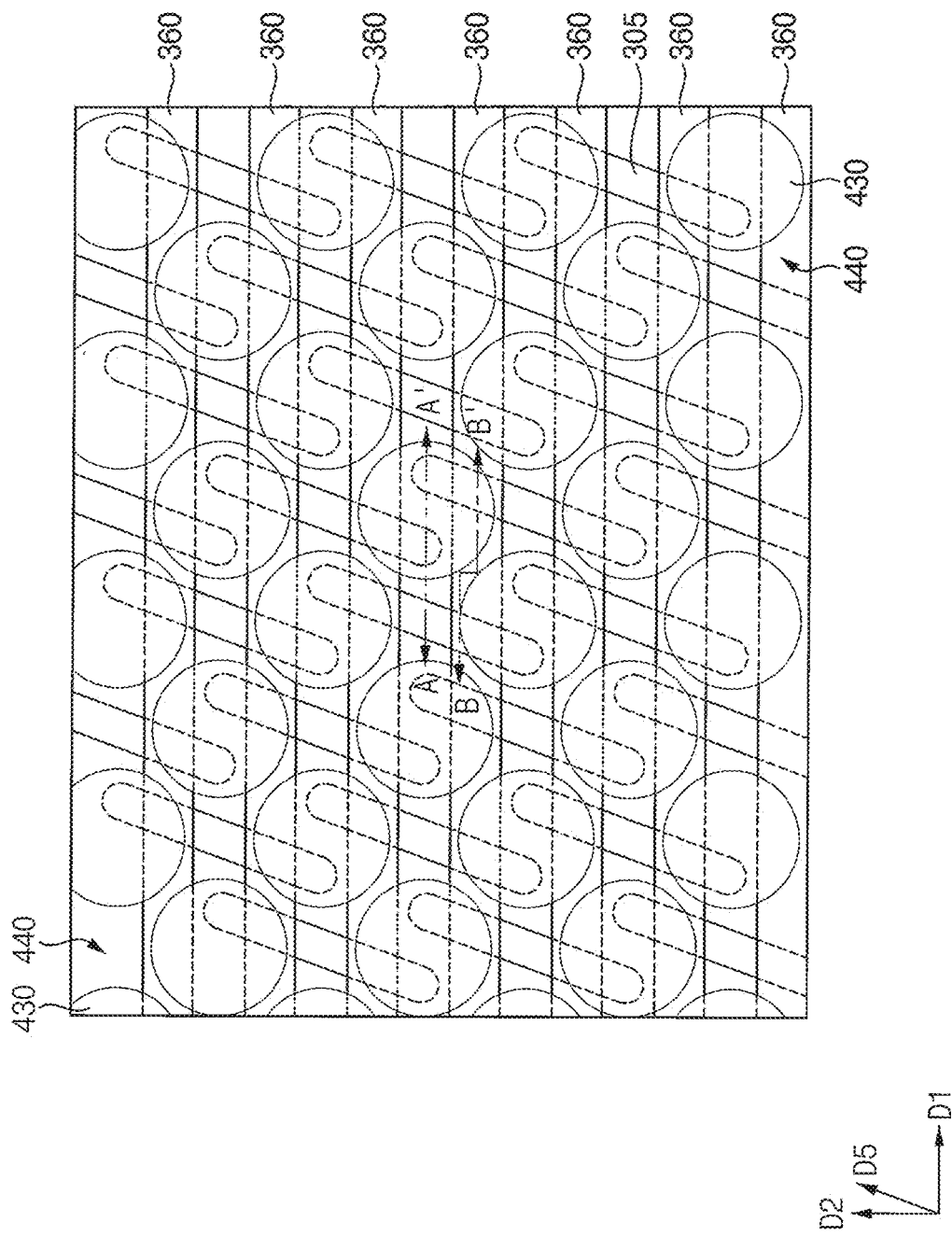
Figure 22:
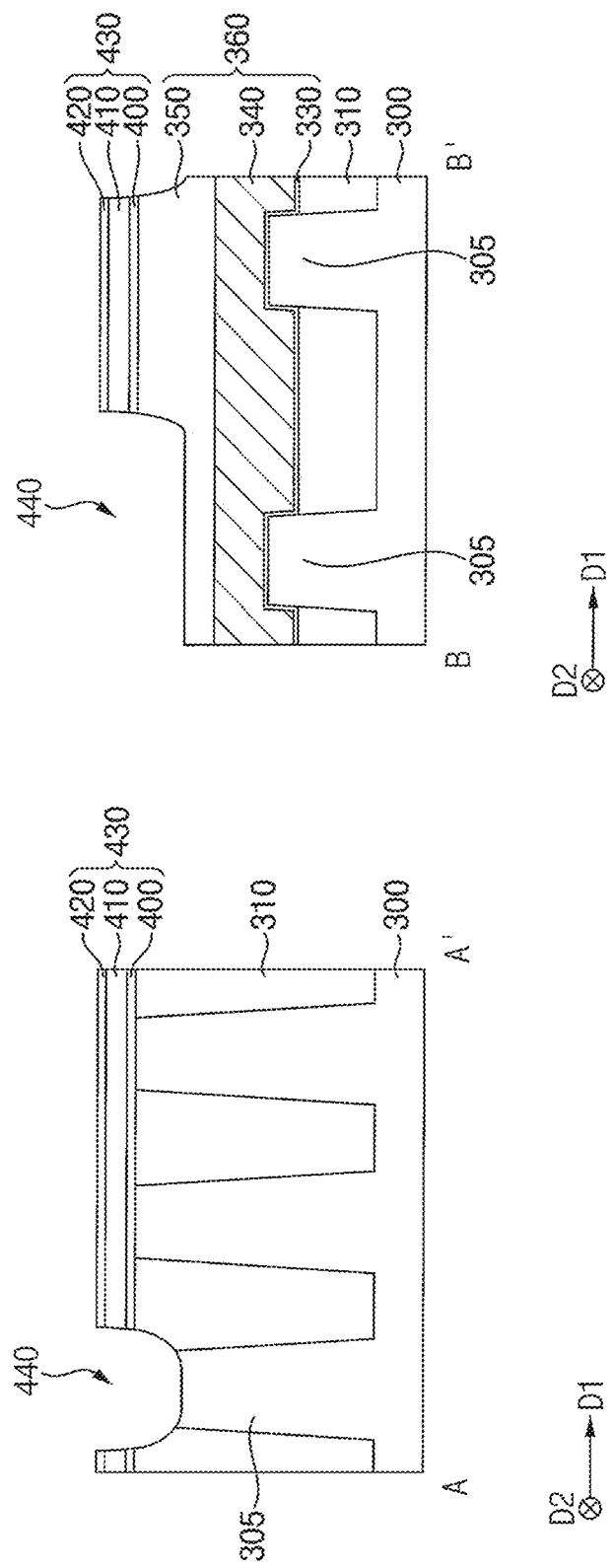

Referring to FIGS. 21 and 22, an insulating layer structure 430 may be formed on the active pattern 305, the isolation pattern 310, and the gate structure 360. The insulating layer structure 430 may include first to third insulating layers 400, 410, and 420 sequentially stacked. The first and third insulating layers 400 and 420 may include, for example, an oxide such as silicon oxide, and the second insulating layer 410 may include, for example, a nitride such as silicon nitride.

The insulating layer structure 430 may be patterned, and the active pattern 305, the isolation pattern 310, and the gate mask 350 included in the gate structure 360 may be partially etched using the patterned insulating layer structure 430 as an etching mask to form a fifth opening 440. In some example embodiments, the insulating layer structure 430 may have a circular shape or an elliptical shape in a plain view, and a plurality of insulating layer structures 430 may be spaced apart from each other in the first and second direction D1 and D2. Each of the insulating layer structures 430 may overlap end portions of ones of the active patterns 305 neighboring in the fifth direction D5, which may face each other, in a vertical direction substantially orthogonal to the upper surface of the substrate 300.

Figure 23:
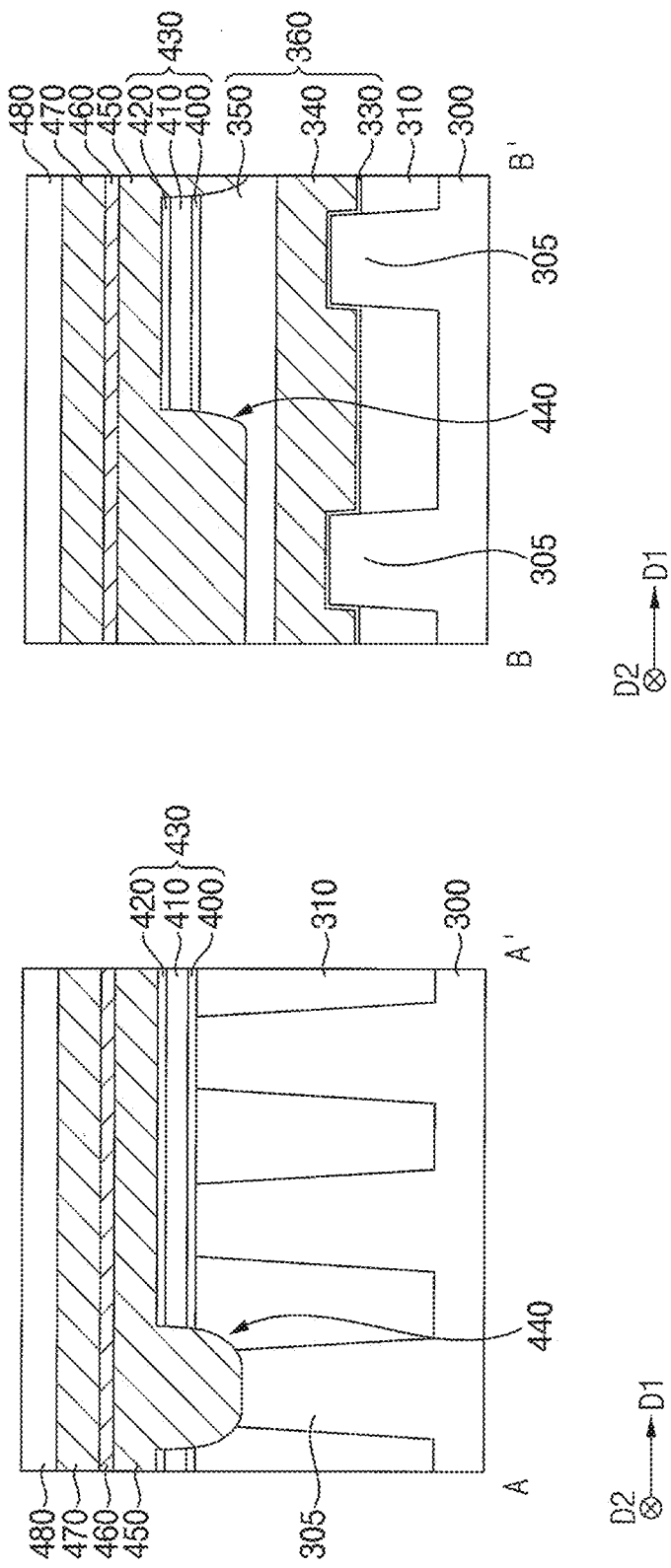

Referring to FIG. 23, a first conductive layer 450, a first barrier layer 460, a second conductive layer 470 and a first mask layer 480 may be sequentially formed on the insulating layer structure 430, and the active pattern 305, the isolation pattern 310 and the gate structure 360 exposed by the fifth opening 440. The first conductive layer 450, the first barrier layer 460, the second conductive layer 470 and the first mask layer 480 may form a conductive structure layer. The first conductive layer 450 may fill the fifth opening 440.

The first conductive layer 450 may include, for example, polysilicon doped with impurities, the first barrier layer 460 may include, for example, a metal silicon nitride such as titanium silicon nitride (TiSiN), the second conductive layer 470 may include, for example, a metal such as tungsten, and the first mask layer 480 may include, for example, a nitride such as silicon nitride.

Figure 25:
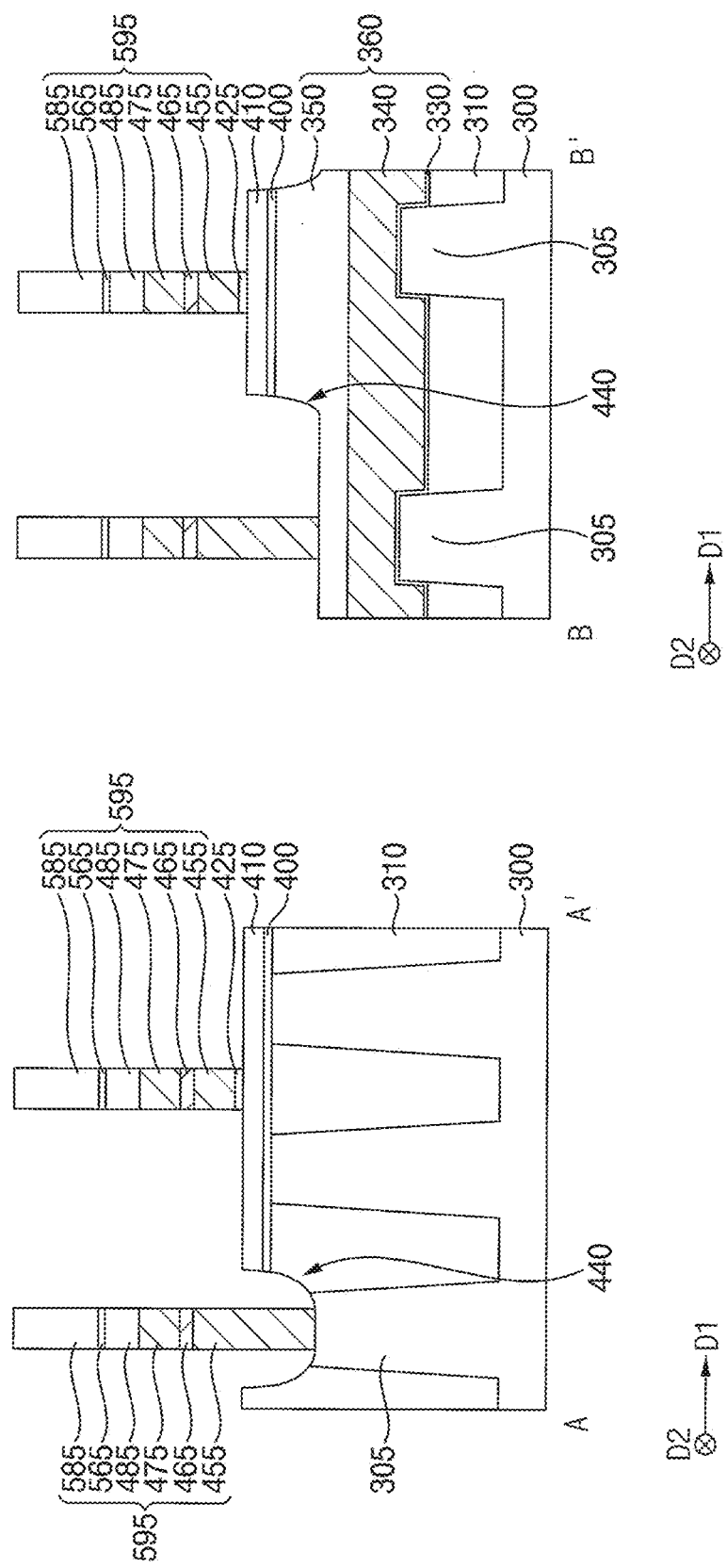

Referring to FIGS. 24 and 25, a first etch stop layer and a first capping layer may be sequentially formed on the conductive structure layer, the first capping layer may be etched to form a first capping pattern 585, and the first etch stop layer, the first mask layer 480, the second conductive layer 470, the first barrier layer 460 and the first conductive layer 450 may be sequentially etched using the first capping pattern 585 as an etch mask.

In some example embodiments, the first capping pattern 585 may extend in the second direction D2, and a plurality of first capping patterns 585 may be spaced apart from each other in the first direction D1.

By the etching process, a first conductive pattern 455, a first barrier pattern 465, a second conductive pattern 475, a first mask 485, a first etch stop pattern 565 and the first capping pattern 585 may be formed on the fifth opening 440, and a third insulating pattern 425, the first conductive pattern 455, the first barrier pattern 465, the second conductive pattern 475, the first mask 485, the first etch stop pattern 565 and the first capping pattern 585 may be sequentially stacked on the second insulating layer 410 of the insulating layer structure 430 at an outside of the fifth opening 440.

Hereinafter, the first conductive pattern 455, the first barrier pattern 465, the second conductive pattern 475, the first mask 485, the first etch stop pattern 565 and the first capping pattern 585 sequentially stacked may be referred to as a bit line structure 595. The first conductive pattern 455, the first barrier pattern 465 and the second conductive pattern 475 may form a conductive structure, and the first mask 485, the first etch stop pattern 565 and the first capping pattern 585 may form an insulating structure. In some example embodiments, the bit line structure 595 may extend in the second direction D2, and a plurality of bit line structures 595 may be spaced apart from each other in the first direction D1.

Figure 26:
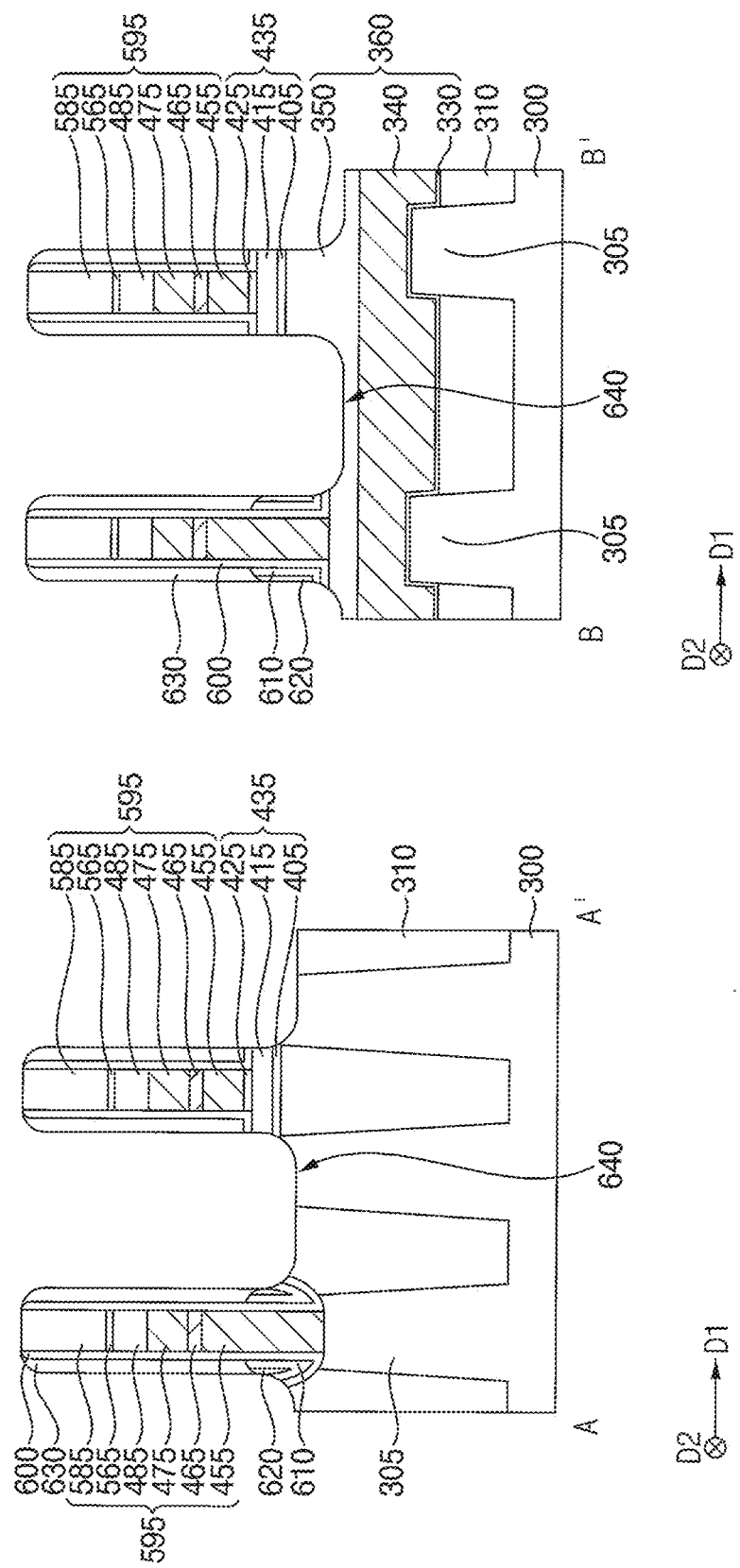

Referring to FIG. 26, a first spacer layer may be formed on the substrate 300 on which the bit line structure 595 is formed, and fourth and fifth insulating layers may be sequentially formed on the first spacer layer.

The first spacer layer may also cover a sidewall of the third insulating pattern 425 under the bit line structure 595 on the second insulating layer 410, and the fifth insulating layer may fill a remaining portion of the fifth opening 440.

The first spacer layer may include, for example, a nitride such as silicon nitride, the fourth insulating layer may include, for example, an oxide such as silicon oxide, and the fifth insulating layer may include, for example, a nitride such as silicon nitride.

The fourth and fifth insulating layers may be etched by an etching process. In some example embodiments, the etching process may be a wet etching process using, for example, phosphoric acid ($H_2PO_3$), SC1, and hydrofluoric acid (HF) as an etchant, and portions of the fourth and fifth insulating layers except for portions thereof in the fifth opening 440 may be removed. Accordingly, most portion of a surface of the first spacer layer, that is, all portions of the surface of the first spacer layer except for a portion of the surface thereof in the fifth opening 440 may be exposed, and the fourth and fourth insulating layers remaining in the fifth opening 440 may form fourth and fifth insulating patterns 610 and 620, respectively.

A second spacer layer may be formed on the exposed surface of the first spacer layer and the fourth and fifth insulating patterns 610 and 620 in the fifth opening 440. The second spacer layer may be anisotropically etched to form a second spacer 630 covering a sidewall of the bit line structure 595 on the surface of the first spacer layer and on the fourth and fifth insulating patterns 610 and 620. The second spacer layer may include, for example, an oxide such as silicon oxide.

A dry etching process may be performed using the first capping pattern 585 and the second spacer 630 as an etch mask to form a sixth opening 640 exposing an upper surface of the active pattern 305, and upper surfaces of the isolation pattern 310 the gate mask 350 may also be exposed by the sixth opening 640.

By the dry etching process, portions of the first spacer layer on upper surfaces of the first capping pattern 585 and the second insulating layer 410 may be removed, and thus a first spacer 600 may be formed on the sidewall of the bit line structure 595. By the dry etching process, the first and second insulating layers 400 and 410 may be partially removed to remain as first and second insulating patterns 405 and 415, respectively, under the bit line structure 595. The first to third insulating patterns 405, 415 and 425 sequentially stacked under the bit line structure 595 may form a first insulating pattern structure.

Figure 27:
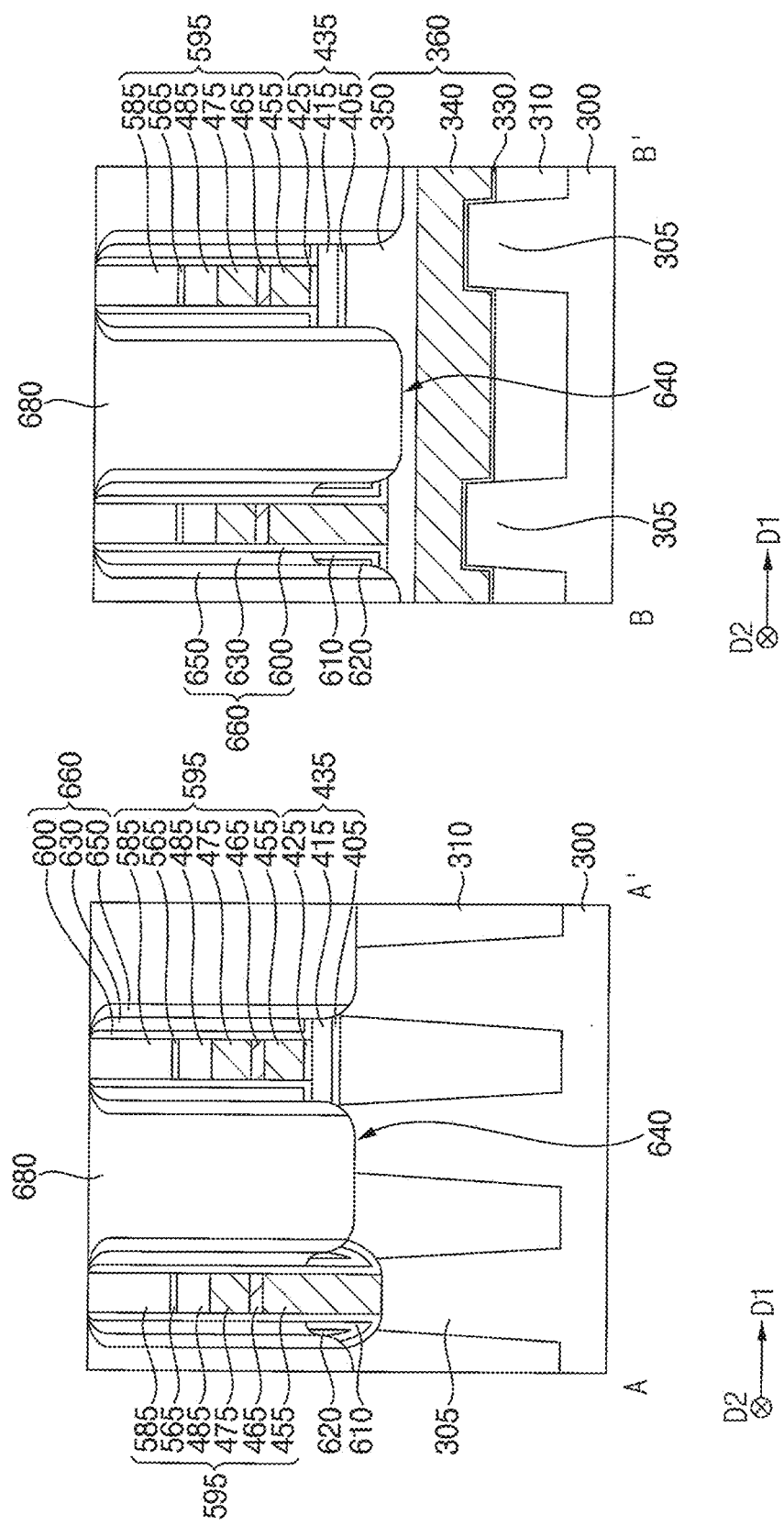

Referring to FIG. 27, a third spacer layer is formed on an upper surface of the first capping pattern 585, an outer sidewall of the second spacer 630, portions of the upper surfaces of the fourth and fifth insulating patterns 610 and 620, and upper surfaces of the active pattern 305, the isolation pattern 310 and the gate mask 350 exposed by the sixth opening 640. The third spacer layer may be anisotropically etched to form a third spacer 650 covering the sidewall of the bit line structure 595. The third spacer layer may include, for example, a nitride such as silicon nitride.

The first to third spacers 600, 630 and 650 sequentially stacked on the sidewall of the bit line structure 595 in a horizontal direction substantially parallel to the upper surface of the substrate 300 may be referred to as a preliminary spacer structure 660.

A first sacrificial layer may be formed to fill the sixth opening 640 on the substrate 300 to a sufficient height, and an upper portion of the first sacrificial layer may be planarized until the upper surface of the first capping pattern 585 is exposed to form a first sacrificial pattern 680 in the sixth opening 640.

In some example embodiments, the first sacrificial pattern 680 may extend in the second direction D2, and a plurality of first sacrificial patterns 680 may be spaced apart from each other in the first direction D1 by the bit line structures 595. The first sacrificial pattern 680 may include, for example, an oxide such as silicon oxide.

Figure 28:
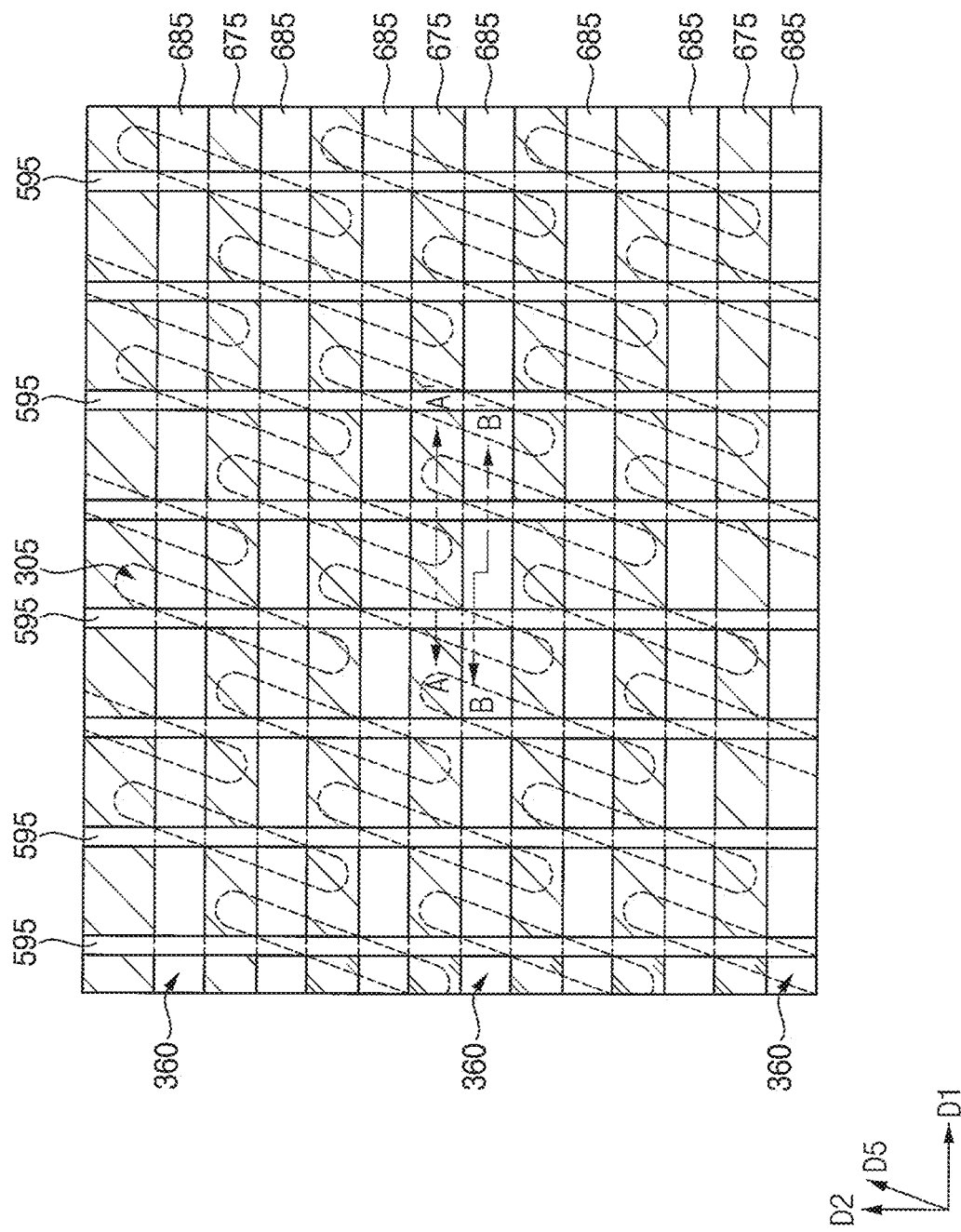
Figure 29:
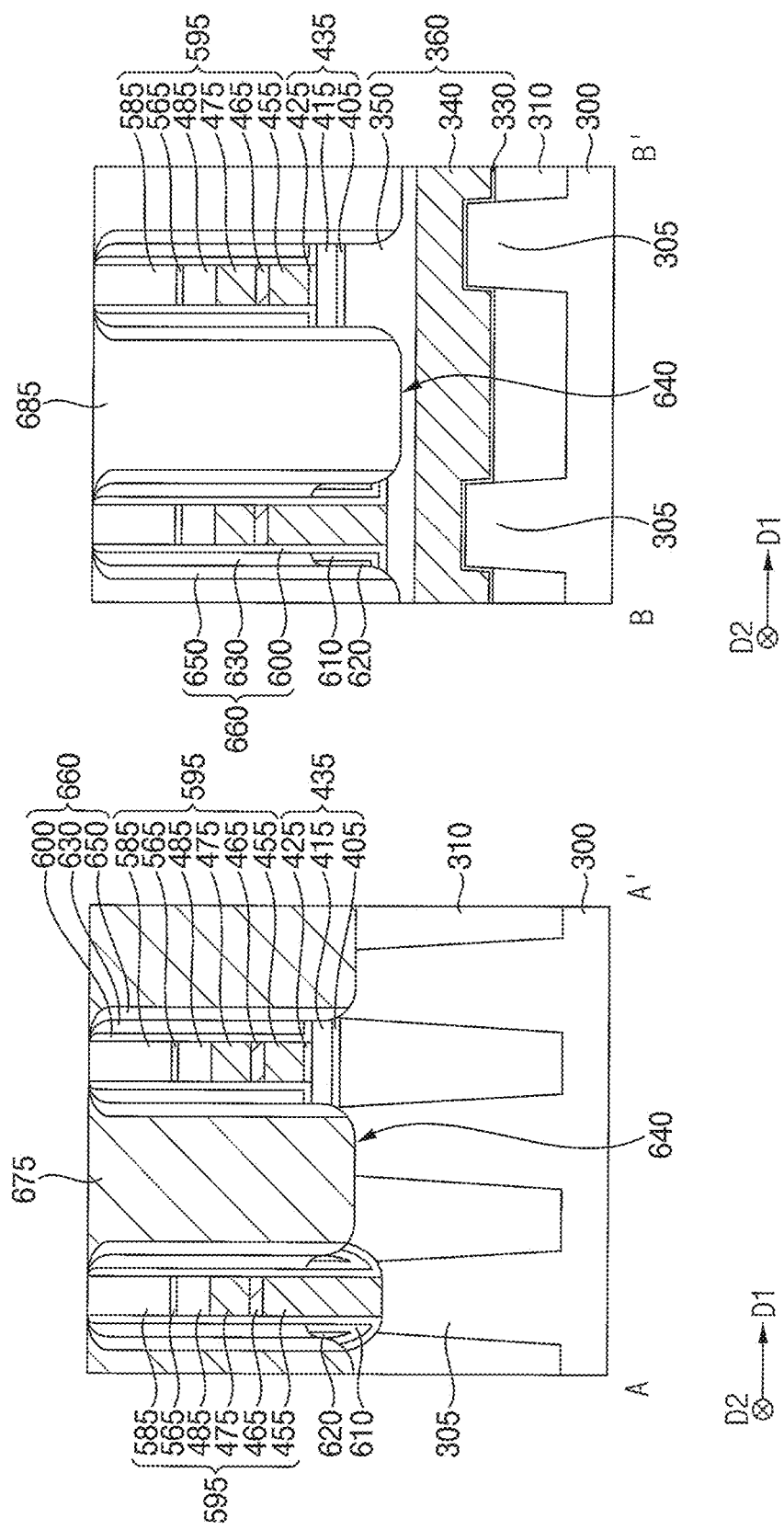

Referring to FIGS. 28 to 29, a second mask including a plurality of seventh openings, each of which may extend in the first direction D1, spaced apart from each other in the second direction D2 may be formed on the first capping pattern 585, the first sacrificial pattern 680 and the preliminary spacer structure 660, and may be etched using the second mask as an etching mask.

In some example embodiments, each of the seventh openings may overlap a region between the gate structures 360 in the vertical direction. By the etching process, an eighth opening exposing upper surfaces of the active pattern 305 and the isolation pattern 310 may be formed between the bit line structures 595 on the substrate 300.

The second mask may be removed, a lower contact plug layer may be formed to fill the eighth opening to a sufficient height, and an upper portion of the lower contact plug layer may be planarized until the upper surface of the first capping pattern 585 and upper surfaces of the first sacrificial pattern 680 and the preliminary spacer structure 660 are exposed. Thus, the lower contact plug layer may be transformed into a plurality of lower contact plugs 675 spaced apart from each other in the second direction D2 between the bit line structures 595. Additionally, the first sacrificial pattern 680 extending in the second direction D2 between the bit line structures 595 may be divided into a plurality of parts in the second direction D2 by the lower contact plugs 675.

The lower contact plug 675 may include, for example, polysilicon doped with impurities.

The first sacrificial pattern 680 may be removed to form a ninth opening, and a second capping pattern 685 may be formed to fill the ninth opening. In some example embodiments, the second capping pattern 685 may overlap the gate structure 360 in the vertical direction. The second capping pattern 685 may include, for example, a nitride such as silicon nitride.

Figure 30:
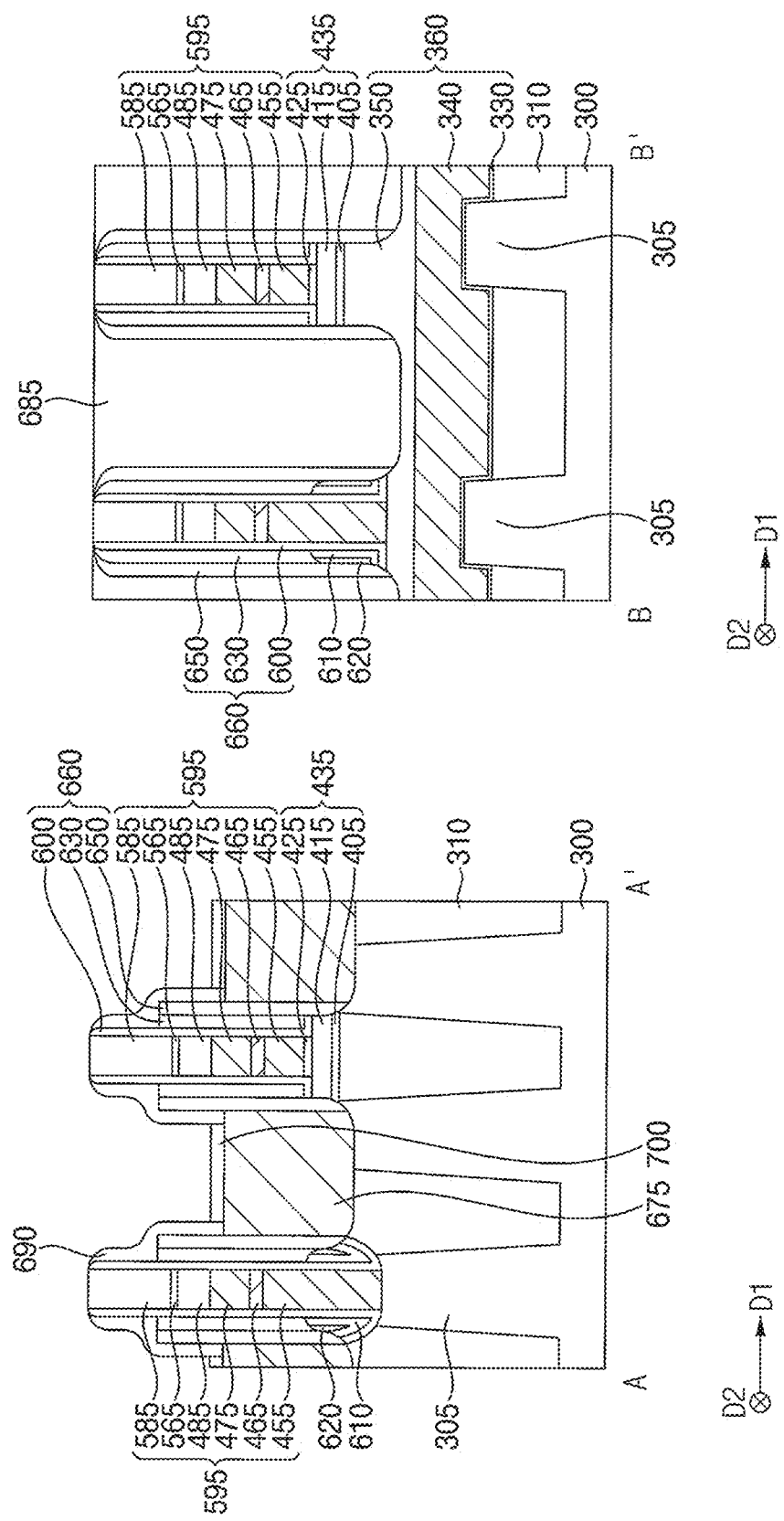

Referring to FIG. 30, an upper portion of the lower contact plug 675 may be removed to expose an upper portion of the preliminary spacer structure 660 on the sidewall of the bit line structure 595, and upper portions of the second and third spacers 630 and 650 of the exposed preliminary spacer structure 660 may be removed.

An upper portion of the lower contact plug 675 may be additionally removed. Thus, an upper surface of the lower contact plug 675 may be lower than upper surfaces of the second and third spacers 630 and 650.

A fourth spacer layer may be formed on the bit line structure 595, the preliminary spacer structure 660, the second capping pattern 685 and the lower contact plug 675, and may be anisotropically etched to form a fourth spacer 690 covering an upper portion of the preliminary spacer structure 660 on the sidewall of the bit line structure 595, and the upper surface of the lower contact plug 675 may be exposed by the etching process.

A metal silicide pattern 700 may be formed on the exposed upper surface of the lower contact plug 675. In some example embodiments, the metal silicide pattern 700 may be formed by forming a first metal layer on the first and second capping patterns 585 and 685, the fourth spacer 690 and the lower contact plug 675, performing a heat treatment thereon, and removing an unreacted portion of the first metal layer. The metal silicide pattern 700 may include, for example, cobalt silicide, nickel silicide, titanium silicide, or the like.

Figure 31:
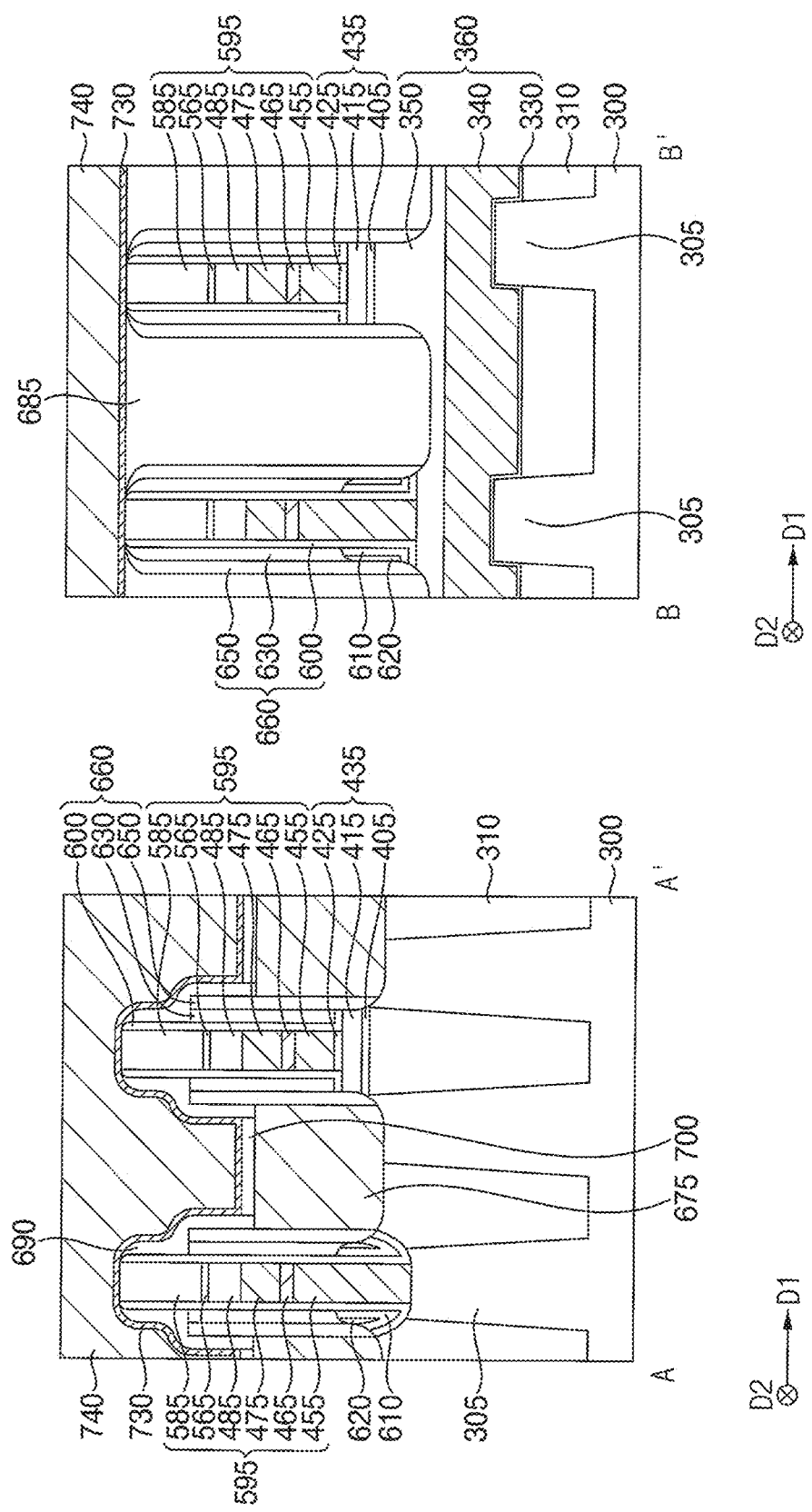

Referring to FIG. 31, a second barrier layer 730 may be formed on the first and second capping patterns 585 and 685, the fourth spacer 690, the metal silicide pattern 700 and the lower contact plug 675, and a second metal layer 740 may be formed on the second barrier layer 730 to fill a space between the bit line structures 595.

The second barrier layer 730 may include, for example, a metal nitride such as titanium nitride, tantalum nitride, or the like, and the second metal layer 740 may include, for example, a metal such as tungsten.

A planarization process may be performed on an upper portion of the second metal layer 740. The planarization process may include, for example, a chemical mechanical polishing (CMP) process and/or an etch-back process.

Figure 32:
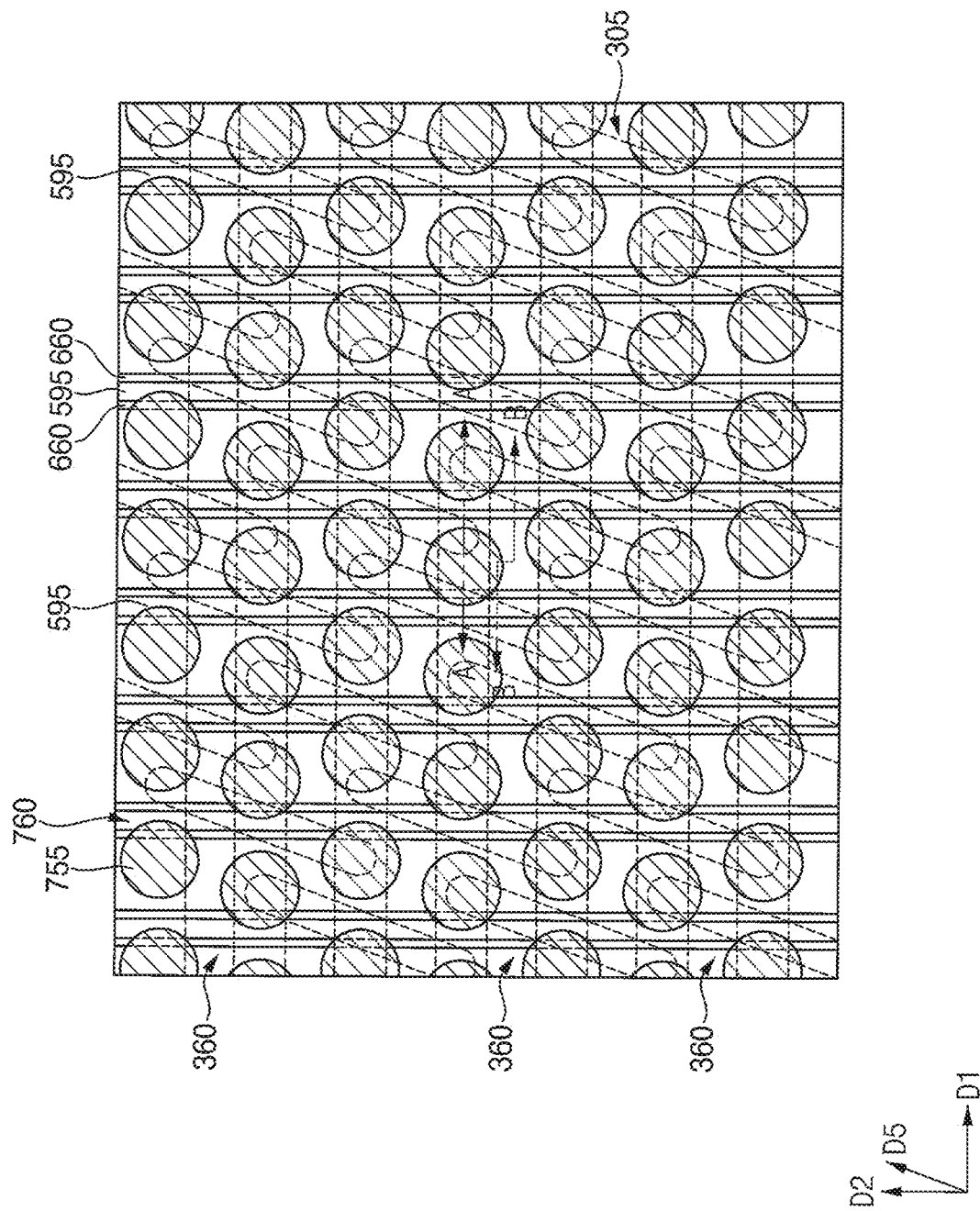
Figure 33:
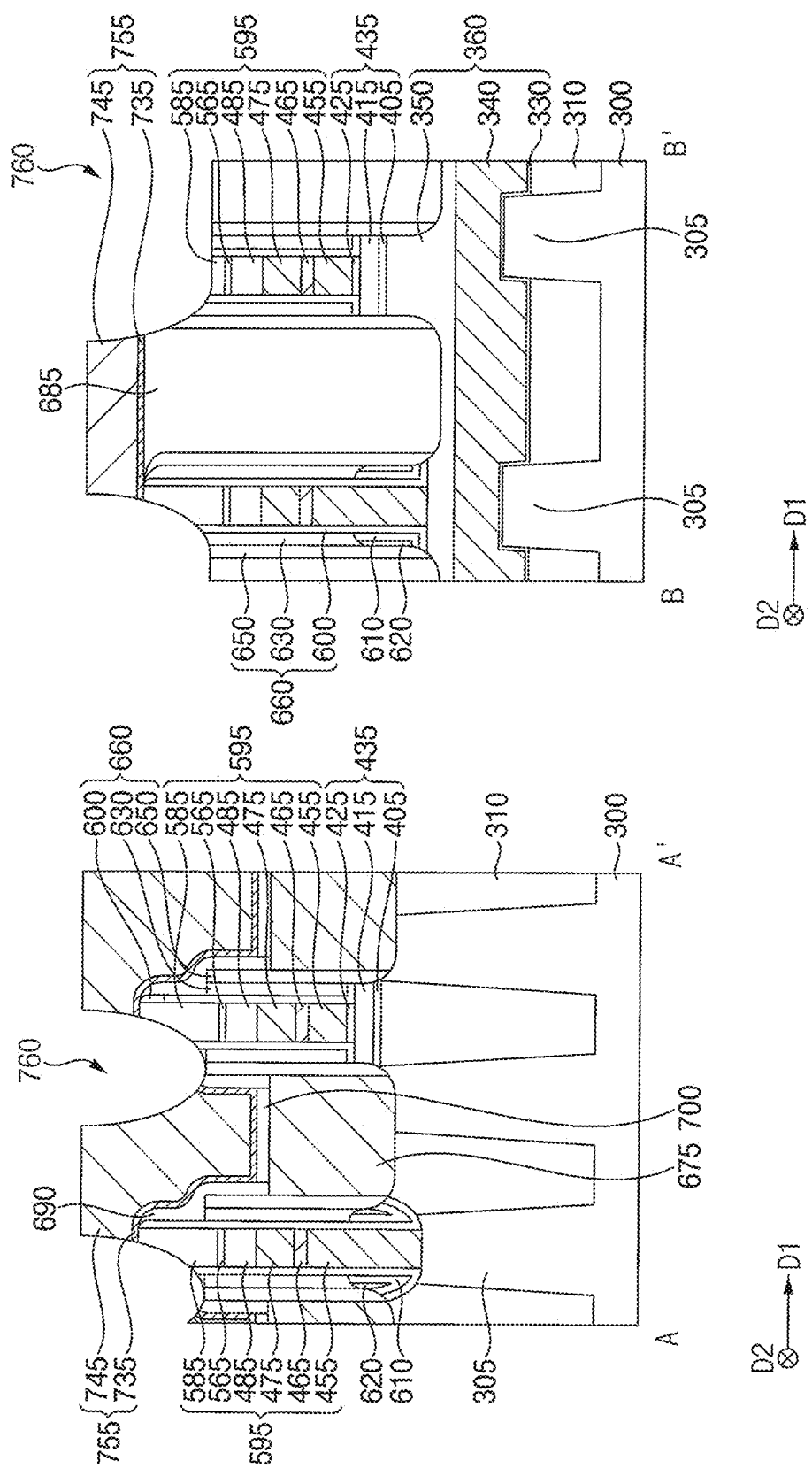

Referring to FIGS. 32 and 33, the second metal layer 740 and the second barrier layer 730 may be patterned to form an upper contact plug 755.

In some example embodiments, a plurality of upper contact plugs 755 may be formed, and a tenth opening may be formed between the upper contact plugs 755.

The tenth opening 760 may be formed by partially removing the first and second capping patterns 585 and 685, the preliminary spacer structure 660 and the fourth spacer 690 as well as the second metal layer 740 and the second barrier layer 730.

The upper contact plug 755 may include a second metal pattern 745 and a second barrier pattern 735 covering a lower surface of the second metal pattern 745. In some example embodiments, the upper contact plug 755 may have a shape of a circle, an ellipse, or a rounded polygon in a plan view, and the upper contact plugs 755 may be arranged, for example, in a honeycomb pattern in the first and second direction D1 and D2, in a plan view.

The lower contact plug 675, the metal silicide pattern 700 and the upper contact plug 755 sequentially stacked on the substrate 300 may form a contact plug structure.

Figure 34:
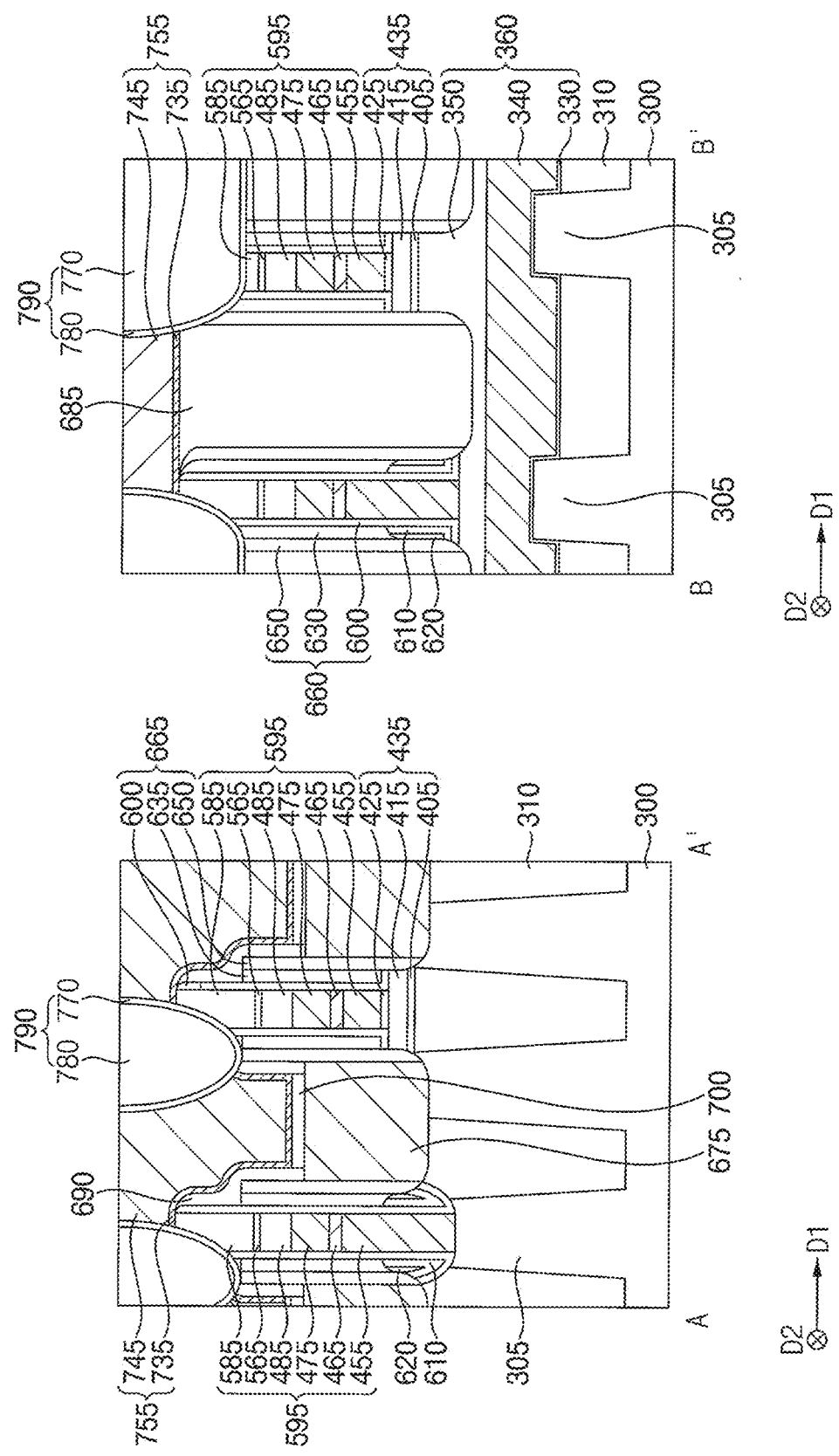

Referring to FIG. 34, the second spacer 630 included in the preliminary spacer structure 660 exposed by the tenth opening 760 may be removed to form an air gap, a sixth insulating pattern 770 may be formed on a bottom and a sidewall of the tenth opening 760, and a seventh insulating pattern 780 may be formed to fill a remaining portion of the tenth opening 760.

Each of the sixth and seventh insulation patterns 770 and 780 may include, for example, a nitride such as silicon nitride, which may form a second insulation pattern structure 790.

A top end of the air gap may be covered by the sixth insulation pattern 770, and thus an air spacer 635 may be formed. The first spacer 600, the air spacer 635 and the third spacer 650 may form a spacer structure 665.

Figure 35:
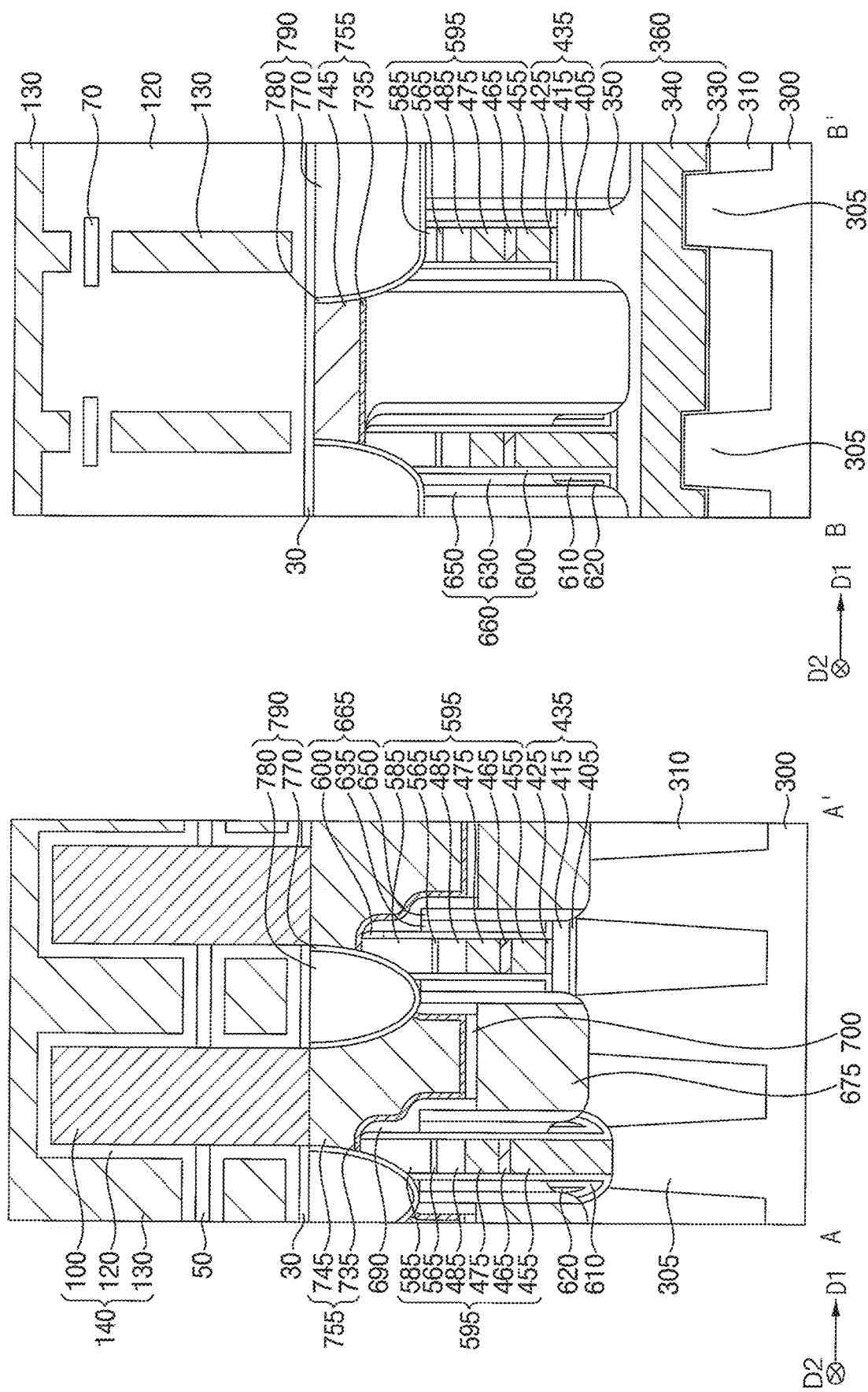

Referring to FIG. 35, a capacitor structure may be formed by processes substantially the same as or similar to the processes described with reference to FIGS. 1 to 18.

Thus, the first electrode 100 may be formed on and contacting an upper surface of the upper contact plug 755. The first support patterns 50 may be formed on the central portion in the vertical direction of each of the first electrodes 100 in the first direction D1, which may be symmetrical with respect to each of the first electrodes 100 in the first direction D1, and the second support patterns 70 may be formed on the upper portion in the vertical direction of each of the first electrodes 100 in the fifth direction D5, which may be symmetrical with respect to each of the first electrodes 100 in the fifth direction D5. The dielectric layer 120 may be formed on the surfaces of the first electrodes 100 and the first and second support patterns 50 and 70, and the second electrode 130 may be formed on the dielectric layer 120.

The semiconductor device may be manufactured by processes described above.

The semiconductor device may have following structural features.

The semiconductor device may include the active pattern 305 on the substrate 300, the gate structure 360 extending in the first direction D1 and buried in the upper portion of the active pattern 305, the bit line structure 595 extending in the second direction D2 on a central upper surface of the active pattern 305, the contact plug structure 675, 700 and 755 on each of opposite end portions of the active pattern 305, the capacitor structure 140, 50 and 70 on the contact plug structure 675, 700 and 755.

In some example embodiments, the capacitor structure 140, 50 and 70 may include the first electrodes 100 spaced apart from each other on the substrate 300 in the horizontal direction substantially parallel to the upper surface of the substrate 300 and contacting the upper surfaces of the contact plug structures 675, 700 and 755, respectively, the first support patterns 40 arranged and spaced apart from each other by the first electrodes 100 in a direction substantially parallel to the upper surface of the substrate 300, for example, in the first direction D1, and contacting the sidewalls of the central portions of the first electrodes 100 in the vertical direction substantially orthogonal to the upper surface of the substrate 300, the second support patterns 70 arranged and spaced apart from each other by the first electrodes 100 in a direction substantially parallel to the upper surface of the substrate 300 and having an acute angle with the first direction D1, for example, in the fifth direction D5, and contacting the sidewalls of the upper portions of the first electrodes 100 in the vertical direction, a dielectric layer 120 on the surfaces of the first electrodes 100 and the first and second support patterns 50 and 70, and the second electrodes 130 on the dielectric layer 120.

In some example embodiments, the active pattern 305 may extend in the fifth direction D5, and a plurality of active patterns 305 may be spaced apart from each other in the first and second directions D1 and D2. In some example embodiments, the gate structures may be spaced apart from each other in the second direction D2, and the bit line structures 595 may be spaced apart from each other in the first direction D1.

In some example embodiments, the contact plug structures 675, 700 and 755 may be spaced apart from each other in the first and second directions D1 and D2, and the contact plug structures may be arranged in a honeycomb shape in a plan view.

While some example embodiments have been particularly shown and described, it will be understood by one of ordinary skill in the art that variations in form and detail may be made therein without departing from the spirit and scope of the claims.

What is claimed is:

1. A capacitor structure, comprising:
   first electrodes on a substrate and spaced apart from each other in a horizontal direction parallel to an upper surface of the substrate;
   first support patterns contacting sidewalls of the first electrodes;
   a dielectric layer on surfaces of the first electrodes and surfaces of the first support patterns; and
   a second electrode on the dielectric layer, wherein
   the first support patterns are arranged in a first direction parallel to the upper surface of the substrate,
   the first support patterns contact the sidewalls of the first electrodes at central portions of the first electrodes in a second direction,
   the second direction is parallel to the upper surface of the substrate and orthogonal to the first direction,
   the first support patterns are not in contact with the sidewalls of the first electrodes at edge portions of the first electrodes in the second direction such that a corresponding first support pattern touches a center of a corresponding first electrode in the second direction and does not touch both edge portions of the corresponding first electrode in the second direction, and
   the corresponding first support pattern is among the first support patterns and the corresponding first electrode is among the first electrodes.

2. The capacitor structure of claim 1, wherein each of the first support patterns has a bar shape extending in the first direction.

3. The capacitor structure of claim 2, wherein the first support patterns have a same width in the second direction.

4. The capacitor structure of claim 1, wherein
   each corresponding first electrode, among the first electrodes, is between an adjacent pair of the first support patterns contacting opposite locations, respectively, in the first direction of the corresponding first electrode, and
   each adjacent pair of the first support patterns in the first direction includes a first one of the first support patterns and a second one of the first support patterns that are symmetrical with respect to the corresponding first electrode therebetween.

5. The capacitor structure of claim 1, further comprising:
   second support patterns contacting the sidewalls of the first electrodes, the second support patterns being spaced apart from the first support patterns in a vertical direction, the vertical direction being orthogonal to the upper surface of the substrate,
   wherein the dielectric layer is on the surfaces of the first electrodes, the surfaces of the first support patterns, and surfaces of the second support patterns.

6. The capacitor structure of claim 5, wherein:
   the second support patterns are arranged in a third direction parallel to the upper surface of the substrate,
   the third direction forms an acute angle with the first direction,
   the second support patterns are in contact with the sidewalls of the first electrodes at central portions of the first electrodes in a fourth direction,
   the fourth direction is parallel to the upper surface of the substrate and orthogonal to the third direction, and the second support patterns are not in contact with the sidewalls of the first electrodes at edge portions of the first electrodes in the fourth direction.

7. The capacitor structure of claim 6, wherein each of the second support patterns has a bar shape extending in the third direction.

8. The capacitor structure of claim 6, wherein
each corresponding one of the first electrodes is between an adjacent pair of the second support patterns contacting opposite locations, respectively, in the third direction of the corresponding one of the first electrodes, and
each adjacent pair of the second support patterns in the third direction includes a first one of the second support patterns and a second one of the second support patterns that are symmetrical with respect to the corresponding one of the first electrodes therebetween.

9. The capacitor structure of claim 1, wherein
each of the first electrodes has a pillar shape extending in a vertical direction, and
the vertical direction is orthogonal to the upper surface of the substrate.

10. The capacitor structure of claim 1, wherein
the first electrodes include a metal, and
the second electrode includes a metal nitride or silicon-germanium doped with impurities.

11. A capacitor structure, comprising:
first electrodes on a substrate and spaced apart from each other in a horizontal direction parallel to an upper surface of the substrate;
first support patterns arranged in a first direction parallel to the upper surface of the substrate, the first support patterns contacting sidewalls of the first electrodes at central portions of the first electrodes in a vertical direction, the vertical direction being orthogonal to the upper surface of the substrate,
and the first support patterns being spaced apart from each other by the first electrodes along the first direction;
second support patterns arranged in a third direction parallel to the upper surface of the substrate, the third direction forming an acute angle with the first direction, the second support patterns contacting the sidewalls of the first electrodes at upper portions of the first electrodes in the vertical direction, the second support patterns being spaced apart from the first support patterns in the vertical direction, and the second support patterns being spaced apart from each other by the first electrodes along the third direction;
a dielectric layer on surfaces of the first electrodes, surfaces of the first support patterns, and surfaces of the second support patterns; and
a second electrode on the dielectric layer, wherein
the first support patterns contact the sidewalls of the first electrodes at central portions of the first electrodes in a second direction,
the second direction is parallel to the upper surface of the substrate and orthogonal to the first direction,
the first support patterns are not in contact with the sidewalls of the first electrodes at edge portions of the first electrodes in the second direction such that a corresponding first support pattern touches a center of a corresponding first electrode in the second direction and does not touch both edge portions of the corresponding first electrode in the second direction, and
the corresponding first support pattern is among the first support patterns and the corresponding first electrode is among the first electrodes.

12. The capacitor structure of claim 11, wherein
each of the first support patterns has a bar shape extending in the first direction, and
each of the second support patterns has a bar shape extending in the third direction.

13. The capacitor structure of claim 12, wherein
the first support patterns have a same width in the second direction,
the second support patterns have equal widths in a fourth direction, and
the fourth direction is parallel to the upper surface of the substrate and orthogonal to the third direction.

14. The capacitor structure of claim 12, wherein
the second support patterns are in contact with the sidewalls of the first electrodes at central portions of the first electrodes in a fourth direction,
the fourth direction is parallel to the upper surface of the substrate and orthogonal to the third direction, and
the second support patterns are not in contact with the sidewalls of the first electrodes at edge portions of the first electrodes in the fourth direction.

15. The capacitor structure of claim 11, wherein
each corresponding first electrode, among the first electrodes, is connected to two of the first support patterns and two of the second support patterns,
the two of the first support patterns contact opposite locations, respectively, in the first direction of the corresponding first electrode and are symmetrical with respect to the corresponding first electrode, and
the two of the second support patterns contact opposite locations, respectively, in the third direction of the corresponding first electrode and are symmetrical with respect to the corresponding first electrode.

16. A semiconductor device, comprising:
an active pattern on a substrate;
a gate structure extending in a first direction parallel to an upper surface of the substrate and buried in an upper portion of the active pattern;
a bit line structure extending in a second direction parallel to the upper surface of the substrate and orthogonal to the first direction, the bit line structure being on a central portion of the active pattern;
a contact plug structure on each of opposite ends of the active pattern; and
a capacitor structure on the contact plug structure, the capacitor structure including,
first electrodes on the substrate and spaced apart from each other in a horizontal direction parallel to the upper surface of the substrate, each of the first electrodes being in contact with an upper surface of the contact plug structure,
first support patterns contacting sidewalls of the first electrodes,
a dielectric layer on surfaces of the first electrodes and surfaces of the first support patterns, and
a second electrode on the dielectric layer, wherein
the first support patterns are arranged in a third direction parallel to the upper surface of the substrate,
the first support patterns are in contact with the sidewalls of the first electrodes at central portions of the first electrodes in a fourth direction,
the fourth direction is parallel to the upper surface of the substrate and orthogonal to the third direction, and
the first support patterns are not in contact with the sidewalls of the first electrodes at edge portions of the first electrodes in the fourth direction such that a corresponding first support pattern contacts a central portion of a corresponding first electrode in the fourth direction and does not touch both edge portions of the corresponding first electrode in the fourth direction, and the corresponding first support pattern is among the first support patterns and the corresponding first electrode is among the first electrodes.

17. The semiconductor device of claim 16, wherein the active pattern is one of a plurality of active patterns on the substrate and spaced apart from each other along the first direction and the second direction, each of the plurality of active patterns extends in a fifth direction parallel to the upper surface of the substrate, the fifth direction forms acute angles with the first direction and the second direction, the gate structure is one of a plurality of gate structures on the substrate and spaced apart from each other in the second direction, and the bit line structure is one of a plurality of bit line structures on the substrate and spaced apart from each other in the first direction.

18. The semiconductor device of claim 17, wherein the contact plug structure is one of a plurality of contact plug structures on the substrate and spaced apart from each other in the first direction and the second direction, and the plurality of contact plug structures are arranged on the substrate in a honeycomb shape in a plan view.

19. The semiconductor device of claim 18, further comprising:

second support patterns contacting the sidewalls of the first electrodes, wherein the second support patterns are spaced apart from the first support patterns in a vertical direction orthogonal to the upper surface of the substrate, and the dielectric layer is on the surfaces of the first electrodes, the surfaces of the first support patterns, and surfaces of the second support patterns.

20. The semiconductor device of claim 19, wherein:

the second support patterns are arranged in a sixth direction parallel to the upper surface of the substrate, the sixth direction forms an acute angle with the third direction, the second support patterns contact the sidewalls of the first electrodes at central portions of the first electrodes in a seventh direction, the seventh direction is parallel to the upper surface of the substrate and orthogonal to the sixth direction, and the second support patterns are not in contact with the sidewalls of the first electrodes at edge portions of the first electrodes in the seventh direction.

* * * * *